US012646683B2

(12) United States Patent
Bowman et al.

(10) Patent No.:  US 12,646,683 B2
(45) Date of Patent:      Jun. 2, 2026

(54) HIGH FREQUENCY RF GENERATOR AND DC PULSING

(71) Applicant: EAGLE HARBOR TECHNOLOGIES, INC., Seattle, WA (US)

(72) Inventors: Christopher Bowman, Seattle, WA (US); Connor Liston, Seattle, WA (US); Kenneth Miller, Seattle, WA (US); Timothy Ziemba, Bainbridge Island, WA (US)

(73) Assignee: Eagle Harbor Technologies, Inc., Seattle, WA (US)

( * ) Notice: Subject to any disclaimer, the term of this patent is extended or adjusted under 35 U.S.C. 154(b) by 871 days.

(21) Appl. No.: 18/055,411

(22) Filed: Nov. 14, 2022

(65) Prior Publication Data

US 2023/0073797 A1      Mar. 9, 2023

Related U.S. Application Data

(63) Continuation of application No. PCT/US2021/032063, filed on May 12, 2021.

(60) Provisional application No. 63/023,611, filed on May 12, 2020.

(51) Int. Cl.
*H01J 37/32*          (2006.01)
(52) U.S. Cl.
CPC .. *H01J 37/32146* (2013.01); *H01J 37/32128* (2013.01); *H01J 2237/0473* (2013.01)
(58) Field of Classification Search
None
See application file for complete search history.

(56) References Cited

U.S. PATENT DOCUMENTS

| | | | |
|---|---|---|---|
| 2,710,933 A | 6/1955 | Dion | |
| 2,773,935 A | 12/1956 | Trousdale | |
| 2,832,832 A | 4/1958 | Trousdale | |

(Continued)

FOREIGN PATENT DOCUMENTS

| | | |
|---|---|---|
| CA | 2292526 A1 | 12/1999 |
| CN | 1602563 A | 3/2005 |

(Continued)

OTHER PUBLICATIONS

Final Office Action in U.S. Appl. No. 18/328,411, dated Jun. 21, 2024, 11 pages.

(Continued)

*Primary Examiner* — Anh Q Tran

(57)          ABSTRACT

A nanosecond pulser system is disclosed. In some embodiments, the nanosecond pulser system may include a high voltage power supply; a nanosecond pulser electrically coupled with the high voltage power supply and switches voltage from the high voltage power supply at high frequencies; a transformer having a primary side and a secondary side, the nanosecond pulser electrically coupled with the primary side of the transformer; and an output electrically coupled with the transformer producing a waveform. In some embodiments, the waveform includes a plurality of high voltage pulses having a pulse amplitude greater than about 2 kV, a pulse width, and a pulse repetition frequency; and a sinusoidal waveform having a waveform frequency and a waveform amplitude greater than 100 V.

18 Claims, 8 Drawing Sheets

(56)     References Cited

U.S. PATENT DOCUMENTS

| | | | |
|---|---|---|---|
| 3,339,108 A | 8/1967 | Holtje |
| 4,070,589 A | 1/1978 | Martinkovic |
| 4,076,996 A | 2/1978 | Maehara et al. |
| 4,438,331 A | 3/1984 | Davis |
| 4,504,895 A | 3/1985 | Steigerwald |
| 4,692,851 A | 9/1987 | Attwood |
| 4,885,074 A | 12/1989 | Susko et al. |
| 4,924,191 A | 5/1990 | Erb et al. |
| 4,992,919 A | 2/1991 | Lee et al. |
| 5,072,191 A | 12/1991 | Nakajima et al. |
| 5,118,969 A | 6/1992 | Ikezi et al. |
| 5,140,510 A | 8/1992 | Myers |
| 5,313,481 A | 5/1994 | Cook et al. |
| 5,321,597 A | 6/1994 | Alacoque |
| 5,325,021 A | 6/1994 | Duckworth et al. |
| 5,392,043 A | 2/1995 | Ribner |
| 5,451,846 A | 9/1995 | Peterson et al. |
| 5,483,731 A | 1/1996 | Prendel et al. |
| 5,488,552 A | 1/1996 | Sakamoto et al. |
| 5,610,452 A | 3/1997 | Shimer et al. |
| 5,623,171 A | 4/1997 | Nakajima |
| 5,654,679 A | 8/1997 | Mavretic et al. |
| 5,656,123 A | 8/1997 | Salimian et al. |
| 5,729,562 A | 3/1998 | Birx et al. |
| 5,796,598 A | 8/1998 | Nowak et al. |
| 5,808,504 A | 9/1998 | Chikai et al. |
| 5,905,646 A | 5/1999 | Crewson et al. |
| 5,917,286 A | 6/1999 | Scholl et al. |
| 5,930,125 A | 7/1999 | Hitchcock et al. |
| 5,933,335 A | 8/1999 | Hitchcock et al. |
| 5,936,481 A | 8/1999 | Fujii |
| 5,968,377 A | 10/1999 | Yuasa et al. |
| 6,059,935 A | 5/2000 | Spence |
| 6,066,901 A | 5/2000 | Burkhart et al. |
| 6,086,730 A | 7/2000 | Liu et al. |
| 6,087,871 A | 7/2000 | Kardo-Syssoev et al. |
| 6,205,074 B1 | 3/2001 | Van Buskirk et al. |
| 6,222,321 B1 | 4/2001 | Scholl et al. |
| 6,233,161 B1 | 5/2001 | Balakrishnan et al. |
| 6,238,387 B1 | 5/2001 | Miller, III |
| 6,239,403 B1 | 5/2001 | Dible et al. |
| 6,253,704 B1 | 7/2001 | Savas |
| 6,300,720 B1 | 10/2001 | Birx |
| 6,359,542 B1 | 3/2002 | Widmayer et al. |
| 6,362,604 B1 | 3/2002 | Cravey |
| 6,392,187 B1 | 5/2002 | Johnson |
| 6,472,822 B1 | 10/2002 | Chen et al. |
| 6,480,399 B2 | 11/2002 | Balakrishnan et al. |
| 6,483,731 B1 | 11/2002 | Isurin et al. |
| 6,496,047 B1 | 12/2002 | Iskander et al. |
| 6,518,195 B1 | 2/2003 | Collins et al. |
| 6,577,135 B1 | 6/2003 | Matthews et al. |
| 6,741,120 B1 | 5/2004 | Tan |
| 6,741,484 B2 | 5/2004 | Crewson et al. |
| 6,831,377 B2 | 12/2004 | Yampolsky et al. |
| 6,897,574 B2 | 5/2005 | Vaysse |
| 6,942,813 B2 | 9/2005 | Ying et al. |
| 6,947,300 B2 | 9/2005 | Pai et al. |
| 7,061,230 B2 | 6/2006 | Kleine et al. |
| 7,180,082 B1 | 2/2007 | Hassanein et al. |
| 7,256,637 B2 | 8/2007 | Iskander et al. |
| 7,291,545 B2 | 11/2007 | Collins et al. |
| 7,307,375 B2 | 12/2007 | Smith et al. |
| 7,319,579 B2 | 1/2008 | Inoue et al. |
| 7,354,501 B2 | 4/2008 | Gondhalekar et al. |
| 7,393,765 B2 | 7/2008 | Hanawa et al. |
| 7,396,746 B2 | 7/2008 | Walther et al. |
| 7,492,138 B2 | 2/2009 | Zhang et al. |
| 7,512,433 B2 | 3/2009 | Bernhart et al. |
| 7,521,370 B2 | 4/2009 | Hoffman |
| 7,549,461 B2 | 6/2009 | Kroliczek et al. |
| 7,601,619 B2 | 10/2009 | Okumura et al. |
| 7,605,385 B2 | 10/2009 | Bauer |
| 7,615,931 B2 | 11/2009 | Hooke et al. |
| 7,767,433 B2 | 8/2010 | Kuthi et al. |
| 7,901,930 B2 | 3/2011 | Kuthi et al. |
| 7,936,544 B2 | 5/2011 | Beland |
| 7,943,006 B2 | 5/2011 | Hoffman |
| 7,948,185 B2 | 5/2011 | Smith et al. |
| 7,989,987 B2 | 8/2011 | McDonald |
| 8,093,797 B2 | 1/2012 | Tyldesley |
| 8,093,979 B2 | 1/2012 | Wilson |
| 8,115,343 B2 | 2/2012 | Sanders et al. |
| 8,120,207 B2 | 2/2012 | Sanders et al. |
| 8,129,653 B2 | 3/2012 | Kirchmeier et al. |
| 8,143,790 B2 | 3/2012 | Smith et al. |
| 8,222,936 B2 | 7/2012 | Friedman et al. |
| 8,259,476 B2 | 9/2012 | Ben-Yaakov et al. |
| 8,436,602 B2 | 5/2013 | Sykes |
| 8,450,985 B2 | 5/2013 | Gray et al. |
| 8,471,642 B2 | 6/2013 | Hill |
| 8,500,963 B2 | 8/2013 | Ye et al. |
| 8,575,843 B2 | 11/2013 | Moore et al. |
| 8,723,591 B2 | 5/2014 | Lee et al. |
| 8,773,184 B1 | 7/2014 | Petrov et al. |
| 8,847,433 B2 | 9/2014 | Vandermey |
| 8,963,377 B2 | 2/2015 | Ziemba et al. |
| 9,067,788 B1 | 6/2015 | Spielman et al. |
| 9,070,396 B1 | 6/2015 | Katchmart et al. |
| 9,084,334 B1 | 7/2015 | Gefter et al. |
| 9,122,350 B2 | 9/2015 | Kao et al. |
| 9,122,360 B2 | 9/2015 | Xu et al. |
| 9,287,086 B2 | 3/2016 | Brouk et al. |
| 9,287,092 B2 | 3/2016 | Brouk et al. |
| 9,306,533 B1 | 4/2016 | Mavretic |
| 9,329,256 B2 | 5/2016 | Dolce |
| 9,417,739 B2 | 8/2016 | Cordeiro et al. |
| 9,435,029 B2 | 9/2016 | Brouk et al. |
| 9,493,765 B2 | 11/2016 | Krishnaswamy et al. |
| 9,515,633 B1 | 12/2016 | Long et al. |
| 9,601,283 B2 | 3/2017 | Ziemba et al. |
| 9,655,221 B2 | 5/2017 | Ziemba et al. |
| 9,706,630 B2 | 7/2017 | Miller et al. |
| 9,729,122 B2 | 8/2017 | Mavretic |
| 9,767,988 B2 | 9/2017 | Brouk et al. |
| 9,881,772 B2 | 1/2018 | Marakhatanov et al. |
| 9,960,763 B2 | 5/2018 | Miller et al. |
| 9,966,231 B2 | 5/2018 | Boswell et al. |
| 10,009,024 B2 | 6/2018 | Gan et al. |
| 10,020,800 B2 | 7/2018 | Prager et al. |
| 10,027,314 B2 | 7/2018 | Prager et al. |
| 10,217,608 B2 | 2/2019 | Mavretic |
| 10,224,822 B2 | 3/2019 | Miller et al. |
| 10,301,587 B2 | 5/2019 | Krishnaswamy et al. |
| 10,304,661 B2 | 5/2019 | Ziemba et al. |
| 10,373,755 B2 | 8/2019 | Prager et al. |
| 10,373,804 B2 | 8/2019 | Koh et al. |
| 10,382,022 B2 | 8/2019 | Prager et al. |
| 10,448,494 B1 | 10/2019 | Dorf et al. |
| 10,460,910 B2 | 10/2019 | Ziemba et al. |
| 10,460,911 B2 | 10/2019 | Ziemba et al. |
| 10,483,089 B2 | 11/2019 | Ziemba et al. |
| 10,483,090 B2 | 11/2019 | Bhutta et al. |
| 10,510,575 B2 | 12/2019 | Kraus et al. |
| 10,555,412 B2 | 2/2020 | Dorf et al. |
| 10,607,814 B2 | 3/2020 | Ziemba et al. |
| 10,631,395 B2 | 4/2020 | Sanders et al. |
| 10,659,019 B2 | 5/2020 | Slobodov et al. |
| 10,707,864 B2 | 7/2020 | Miller et al. |
| 10,734,906 B2 | 8/2020 | Miller et al. |
| 10,777,388 B2 | 9/2020 | Ziemba et al. |
| 10,796,887 B2 | 10/2020 | Prager et al. |
| 10,811,230 B2 | 10/2020 | Ziemba et al. |
| 10,876,241 B2 | 12/2020 | Hu et al. |
| 10,892,140 B2 | 1/2021 | Ziemba et al. |
| 10,896,809 B2 | 1/2021 | Ziemba et al. |
| 10,903,047 B2 | 1/2021 | Ziemba et al. |
| 10,978,955 B2 | 4/2021 | Ziemba et al. |
| 11,004,660 B2 | 5/2021 | Prager et al. |
| 11,302,518 B2 | 4/2022 | Prager et al. |
| 11,527,383 B2 | 12/2022 | Ziemba et al. |
| 11,670,484 B2 | 6/2023 | Prager et al. |
| 2001/0008552 A1 | 7/2001 | Harada et al. |
| 2001/0023822 A1 | 9/2001 | Koizumi et al. |

(56) References Cited

U.S. PATENT DOCUMENTS

| | | |
|---|---|---|
| 2002/0016617 A1 | 2/2002 | Oldham |
| 2002/0140464 A1 | 10/2002 | Yampolsky et al. |
| 2002/0180276 A1 | 12/2002 | Sakuma et al. |
| 2002/0186577 A1 | 12/2002 | Kirbie |
| 2003/0021125 A1 | 1/2003 | Rufer et al. |
| 2003/0054647 A1 | 3/2003 | Suemasa et al. |
| 2003/0071035 A1 | 4/2003 | Brailove |
| 2003/0137791 A1 | 7/2003 | Arnet et al. |
| 2003/0169107 A1 | 9/2003 | LeChevalier |
| 2004/0085784 A1 | 5/2004 | Salama et al. |
| 2004/0149217 A1 | 8/2004 | Collins et al. |
| 2004/0173570 A1 | 9/2004 | Ying et al. |
| 2004/0253486 A1 | 12/2004 | Chen et al. |
| 2004/0263412 A1 | 12/2004 | Pribyl |
| 2005/0152159 A1 | 7/2005 | Isurin et al. |
| 2005/0219302 A1 | 10/2005 | Vogeley |
| 2005/0270096 A1 | 12/2005 | Coleman |
| 2006/0048894 A1 | 3/2006 | Yamazaki et al. |
| 2006/0187607 A1 | 8/2006 | Mo |
| 2006/0192774 A1 | 8/2006 | Yasumura |
| 2006/0210020 A1 | 9/2006 | Takahashi et al. |
| 2006/0274887 A1 | 12/2006 | Sakamoto et al. |
| 2007/0018504 A1 | 1/2007 | Wiener et al. |
| 2007/0114981 A1 | 5/2007 | Vasquez et al. |
| 2007/0115705 A1 | 5/2007 | Gotzenberger et al. |
| 2007/0212811 A1 | 9/2007 | Hanawa et al. |
| 2007/0235412 A1 | 10/2007 | Fischer |
| 2008/0062733 A1 | 3/2008 | Gay |
| 2008/0099039 A1 | 5/2008 | Krassnitzer et al. |
| 2008/0099326 A1 | 5/2008 | Ye et al. |
| 2008/0106151 A1 | 5/2008 | Ryoo et al. |
| 2008/0143260 A1 | 6/2008 | Tuymer et al. |
| 2008/0198634 A1 | 8/2008 | Scheel et al. |
| 2008/0231337 A1 | 9/2008 | Krishnaswamy et al. |
| 2008/0252225 A1 | 10/2008 | Kurachi et al. |
| 2008/0272706 A1 | 11/2008 | Kwon et al. |
| 2009/0016549 A1 | 1/2009 | French et al. |
| 2009/0078678 A1 | 3/2009 | Kojima et al. |
| 2009/0108759 A1 | 4/2009 | Tao et al. |
| 2009/0194508 A1 | 8/2009 | Ui et al. |
| 2009/0211898 A1 | 8/2009 | Chen et al. |
| 2009/0255800 A1 | 10/2009 | Koshimizu |
| 2009/0298287 A1 | 12/2009 | Shannon et al. |
| 2010/0007358 A1 | 1/2010 | Schaerrer et al. |
| 2010/0148847 A1 | 6/2010 | Schurack et al. |
| 2010/0252729 A1 | 10/2010 | Jolliffe et al. |
| 2010/0284208 A1 | 11/2010 | Nguyen et al. |
| 2011/0001438 A1 | 1/2011 | Chemel et al. |
| 2011/0140607 A1 | 6/2011 | Moore et al. |
| 2011/0177694 A1 | 7/2011 | Chen et al. |
| 2011/0223750 A1 | 9/2011 | Hayashi et al. |
| 2011/0248633 A1 | 10/2011 | Nauman et al. |
| 2011/0309748 A1 | 12/2011 | Xia |
| 2012/0016282 A1 | 1/2012 | Van Brunt et al. |
| 2012/0052599 A1 | 3/2012 | Brouk et al. |
| 2012/0081350 A1 | 4/2012 | Sano et al. |
| 2012/0129301 A1 | 5/2012 | Or-Bach et al. |
| 2012/0155613 A1 | 6/2012 | Caiafa et al. |
| 2012/0228263 A1 | 9/2012 | Ui et al. |
| 2013/0024784 A1 | 1/2013 | Lifton |
| 2013/0027848 A1 | 1/2013 | Said |
| 2013/0059448 A1 | 3/2013 | Marakhtanov et al. |
| 2013/0075390 A1 | 3/2013 | Ashida |
| 2013/0092529 A1 | 4/2013 | Singh et al. |
| 2013/0113650 A1 | 5/2013 | Behbahani et al. |
| 2013/0174105 A1 | 7/2013 | Nishio et al. |
| 2013/0175575 A1 | 7/2013 | Ziemba et al. |
| 2013/0213935 A1 | 8/2013 | Liao et al. |
| 2013/0228550 A1 | 9/2013 | Mori et al. |
| 2014/0009969 A1 | 1/2014 | Yuzurihara et al. |
| 2014/0021180 A1 | 1/2014 | Vogel |
| 2014/0077611 A1 | 3/2014 | Young et al. |
| 2014/0109886 A1 | 4/2014 | Singleton et al. |
| 2014/0118414 A1 | 5/2014 | Seo et al. |
| 2014/0146571 A1 | 5/2014 | Ryoo et al. |
| 2014/0268968 A1 | 9/2014 | Richardson |
| 2014/0354343 A1 | 12/2014 | Ziemba et al. |
| 2015/0028932 A1 | 1/2015 | Ziemba et al. |
| 2015/0076372 A1 | 3/2015 | Ziemba et al. |
| 2015/0084509 A1 | 3/2015 | Yuzurihara et al. |
| 2015/0130525 A1 | 5/2015 | Miller et al. |
| 2015/0155086 A1 | 6/2015 | Matsuura |
| 2015/0206716 A1 | 7/2015 | Kim et al. |
| 2015/0256086 A1 | 9/2015 | Miller et al. |
| 2015/0288335 A1 | 10/2015 | Hoyerby |
| 2015/0303914 A1 | 10/2015 | Ziemba et al. |
| 2015/0311680 A1 | 10/2015 | Burrows et al. |
| 2015/0318846 A1 | 11/2015 | Prager et al. |
| 2016/0020070 A1 | 1/2016 | Kim et al. |
| 2016/0020072 A1 | 1/2016 | Brouk et al. |
| 2016/0020672 A1 | 1/2016 | Shuck et al. |
| 2016/0182001 A1 | 6/2016 | Zeng et al. |
| 2016/0220670 A1 | 8/2016 | Kalghatgi et al. |
| 2016/0241234 A1 | 8/2016 | Mavretic |
| 2016/0269195 A1 | 9/2016 | Coenen et al. |
| 2016/0327029 A1 | 11/2016 | Ziemba et al. |
| 2016/0327089 A1 | 11/2016 | Adam et al. |
| 2016/0358755 A1 | 12/2016 | Long et al. |
| 2017/0083810 A1 | 3/2017 | Ielmini et al. |
| 2017/0104469 A1 | 4/2017 | Mavretic |
| 2017/0126049 A1 | 5/2017 | Pan et al. |
| 2017/0154726 A1 | 6/2017 | Prager et al. |
| 2017/0243731 A1 | 8/2017 | Ziemba et al. |
| 2017/0294842 A1 | 10/2017 | Miller et al. |
| 2017/0311431 A1 | 10/2017 | Park |
| 2017/0314133 A1 | 11/2017 | Kim et al. |
| 2017/0330729 A1 | 11/2017 | Mavretic |
| 2017/0359886 A1 | 12/2017 | Binderbauer et al. |
| 2017/0366173 A1 | 12/2017 | Miller et al. |
| 2018/0041183 A1 | 2/2018 | Mavretic et al. |
| 2018/0226896 A1 | 8/2018 | Miller et al. |
| 2018/0286636 A1 | 10/2018 | Ziemba et al. |
| 2018/0315583 A1 | 11/2018 | Luere et al. |
| 2018/0331655 A1 | 11/2018 | Prager et al. |
| 2018/0374689 A1 | 12/2018 | Abraham et al. |
| 2019/0074806 A1 | 3/2019 | Scott et al. |
| 2019/0080884 A1 | 3/2019 | Ziemba et al. |
| 2019/0103253 A1 | 4/2019 | Lill et al. |
| 2019/0131110 A1 | 5/2019 | Ziemba et al. |
| 2019/0157044 A1* | 5/2019 | Ziemba ................. H03K 3/021 |
| 2019/0157980 A1 | 5/2019 | Ji et al. |
| 2019/0172683 A1 | 6/2019 | Mavretic et al. |
| 2019/0172685 A1 | 6/2019 | Van Zyl et al. |
| 2019/0180982 A1 | 6/2019 | Brouk et al. |
| 2019/0228952 A1 | 7/2019 | Dorf et al. |
| 2019/0236426 A1 | 8/2019 | Zhang et al. |
| 2019/0277804 A1 | 9/2019 | Prager et al. |
| 2019/0295821 A1 | 9/2019 | Shoeb et al. |
| 2019/0326092 A1 | 10/2019 | Ogasawara et al. |
| 2019/0348258 A1 | 11/2019 | Koh et al. |
| 2019/0350072 A1* | 11/2019 | Dorf ................. H01J 37/32174 |
| 2019/0393791 A1* | 12/2019 | Ziemba .................... H03H 7/01 |
| 2020/0035457 A1 | 1/2020 | Ziemba et al. |
| 2020/0035458 A1 | 1/2020 | Ziemba et al. |
| 2020/0037468 A1 | 1/2020 | Ziemba et al. |
| 2020/0043702 A1 | 2/2020 | Ziemba et al. |
| 2020/0051786 A1 | 2/2020 | Ziemba et al. |
| 2020/0144030 A1 | 5/2020 | Prager et al. |
| 2020/0168437 A1 | 5/2020 | Ziemba et al. |
| 2020/0176221 A1 | 6/2020 | Prager et al. |
| 2021/0013874 A1 | 1/2021 | Miller et al. |
| 2021/0091759 A1 | 3/2021 | Prager et al. |
| 2021/0152163 A1 | 5/2021 | Miller et al. |
| 2021/0399721 A1 | 12/2021 | Prager et al. |
| 2021/0408917 A1 | 12/2021 | Miller et al. |
| 2022/0020566 A1 | 1/2022 | Slobodov et al. |

FOREIGN PATENT DOCUMENTS

| | | | |
|---|---|---|---|
| CN | 101043784 A | 9/2007 | |
| CN | 101447163 A | 6/2009 | |
| CN | 101534071 A | 9/2009 | |
| CN | 101647183 A | 2/2010 | |
| CN | 101689498 A | 3/2010 | |

(56) References Cited

FOREIGN PATENT DOCUMENTS

| CN | 103222344 | A | 7/2013 |
|----|-----------|---|--------|
| CN | 104254187 | A | 12/2014 |
| CN | 105099212 | A | 11/2015 |
| CN | 103458600 | B | 7/2016 |
| CN | 106537776 | A | 3/2017 |
| CN | 107070228 | A | 8/2017 |
| CN | 108093551 | A | 5/2018 |
| EP | 0174164 | A2 | 3/1986 |
| EP | 0947048 | A1 | 10/1999 |
| EP | 1128557 | A2 | 8/2001 |
| EP | 1143497 | A1 | 10/2001 |
| EP | 1515430 | A1 | 3/2005 |
| FR | 2771563 | A1 | 5/1999 |
| JP | H09129621 | A | 5/1997 |
| JP | H09330915 | A | 12/1997 |
| JP | H11224796 | A | 8/1999 |
| JP | 2000268996 | A | 9/2000 |
| JP | 2005506660 | A | 3/2005 |
| JP | 2005203491 | A | 7/2005 |
| JP | 2009187975 | A | 8/2009 |
| JP | 2009263778 | A | 11/2009 |
| JP | 2010504614 | A | 2/2010 |
| JP | 2010532549 | A | 10/2010 |
| JP | 2011211168 | A | 10/2011 |
| JP | 2012205339 | A | 10/2012 |
| JP | 5429391 | B2 | 2/2014 |
| JP | 2015097433 | A | 5/2015 |
| JP | 2016046951 | A | 4/2016 |
| JP | 2018535504 | A | 11/2018 |
| KR | 20010080047 | A | 8/2001 |
| KR | 20180052772 | A | 5/2018 |
| SE | 9101281 | L | 10/1991 |
| TW | 200732488 | A | 9/2007 |
| TW | 200739723 | A | 10/2007 |
| TW | I355212 | B | 12/2011 |
| TW | 201515525 | A | 4/2015 |
| TW | 201737338 | A | 10/2017 |
| WO | 9738479 | A1 | 10/1997 |
| WO | 9811655 | A1 | 3/1998 |
| WO | 0193419 | A1 | 12/2001 |
| WO | 2008044633 | A1 | 4/2008 |
| WO | 2010069317 | A1 | 6/2010 |
| WO | 2011052653 | A1 | 5/2011 |
| WO | 2014036000 | A1 | 3/2014 |
| WO | 2016171582 | A1 | 10/2016 |
| WO | 2017126662 | A1 | 7/2017 |
| WO | 2017201209 | A1 | 11/2017 |
| WO | 2018186901 | A1 | 10/2018 |
| WO | 2019148010 | A1 | 8/2019 |

OTHER PUBLICATIONS

Notice of Allowance in U.S. Appl. No. 17/234,773, dated Sep. 14, 2022, 09 pages.
Notice of Allowance in U.S. Appl. No. 17/359,498, dated Oct. 12, 2022, 09 pages.
Final Office Action in U.S. Appl. No. 17/231,931, dated Jan. 20, 2023, 19 pages.
Non Final Office Action in U.S. Appl. No. 17/366,000, dated Feb. 16, 2023, 13 pages.
Notice of Reason for Refusal for JP Patent Application No. 2023-063348, mailed on Mar. 9, 2023, 8 pages.
Notice of Allowance in U.S. Appl. No. 17/231,931 dated Mar. 29, 2023, 8 pages.
Notice of Reason for Refusal for JP Patent Application No. 2021-577859, mailed on Jun. 13, 2023, 14 pages.
Notice of Allowance in U.S. Appl. No. 17/366,000, dated Jul. 14, 2023, 9 pages.
International Search Report and Written Opinion as issued in connection with International Patent Application No. PCT/US2023/069316, mailed Sep. 5, 2023, 08 pages.
Notice of Reason for Refusal for JP Patent Application No. 2023-063348, mailed on Nov. 14, 2023, 12 pages.
Office Action in KR Patent application No. 2021-7020469 dated Nov. 24, 2023, 15 pages.
Non-Final Office Action in U.S. Appl. No. 18/328,411, dated Dec. 21, 2023, 16 pages.
First Office Action in CN Patent application No. 201980090264.1 dated Jan. 8, 2024, 18 pages.
Office Action in KR Patent application No. 2021-7027810 dated Feb. 15, 2024, 14 pages.
Restriction Requirement in U.S. Appl. No. 17/214,772, dated Mar. 18, 2024, 5 pages.
Decision of Refusal for JP Patent Application No. 2023-063348, mailed on Apr. 2, 2024, 7 pages.
Office Action in KR Patent application No. 2023-7028274 dated Apr. 19, 2024, 4 pages.
Office Action in KR Patent application No. 2023-7029360 dated Apr. 19, 2024, 10 pages.
Extended European Search Report for Application No. 21803769.5 received Apr. 29, 2024, 5 pages.
Bland, M.J., et al., "A High Power RF Power Supply for High Energy Physics Applications," Proceedings of 2005 the Particle Accelerator Conference, IEEE pp. 4018-4020 (May 16-20, 2005).
Dammertz, G., et al., "Development of Multimegawatt Gyrotrons for Fusion Plasma Heating and current Drive," IEEE Transactions on Electron Devices, vol. 52, No. 5, pp. 808-817 (Apr. 2005) (Abstract).
Garwin, R., "Pulsed Power Peer Review Committee Report," Sandia National Laboratories Report, SAND2000-2515, pp. 3-38 (Oct. 2000).
Gaudet, J.A., et al., "Research issues in Developing Compact Pulsed Power for High Peak Power Applications on Mobile Platforms," Proceedings of the IEEE, vol. 92, No. 7, pp. 1144-1165 (Jul. 2004).
Goodman, E. A., "Characteristics of sheet windings in transformers", IEEE Engineering, vol. 82, No. 11, pp. 673-676 (Nov. 1963) (Abstract).
In, Y., et al., "On the roles of direct feedback and error field correction in stabilizing resistive-wall modes," Nuclear 2 Fusion, vol. 50, No. 4, pp. 1-5 (2010).
Kim, J.H., et al., "High Voltage Pulsed Power Supply Using IGBT Stacks," IEEE Transactions on Dielectrics and Electrical insulation, vol. 14, No. 4, pp. 921-926 (Aug. 2007).
Locher, R., "Introduction to Power MOSFETs and their Applications (Application Note 558)," Fairchild Semiconductor, 15 pages (Oct. 1998).
Locher, R.E., and Pathak, A.D., "Use of BiMOSFETs in Modern Radar Transmitters," IEEE International Conference on Power Electronics and Drive Systems, pp. 776-782 (2001).
Pokryvailo, A., et al., "A 1KW Pulsed Corona System for Pollution Control Applications," 14th IEEE International Pulsed Power Conference, Dallas, TX, USA (Jun. 15-18, 2003).
Pokryvailo, A., et al., "High-Power Pulsed Corona for Treatment of Pollutants in Heterogeneous Media," IEEE Transactions on Plasma Science, vol. 34, No. 5, pp. 1731-1743 (Oct. 2006) (Abstract).
Prager, J.R. et al., "A High Voltage Nanosecond Pulser with Variable Pulse Width and Pulse Repetition Frequency control For Nonequilibrium Plasma Applications", 41st International Conference on Plasma Sciences held with 2014 IEEE International Conference on High-Power Particle Beams, May 25-29, 2014, 6, Washington, D.C.
Pustylnik, M., et al., "High-voltage nanosecond pulses in a low-pressure radiofrequency discharge", Physical Review E, vol. 87, No. 6, pp. 1-9 (2013).
Quinley, M., et al., "High Voltage Nanosecond Pulser Operating at 30 kW and 400 kHz" APS-GEC-2018, 1 page (2018).
Rao, X., et al., "Combustion Dynamics of Plasma-Enhanced Premixed and Nonpremixed Flames," IEEE Transactions on Plasma Science, vol. 38, No. 12, pp. 3265-3271 (Dec. 2010).
Reass, W.A., et al., "Progress Towards a 20 KV, 2 KA Plasma Source Ion Implantation Modulator for Automotive Production of Diamond Film on Aluminum," Submitted to 22nd International Power Symposium, Boca Raton, FL, 6 pages (Jun. 24-27, 1996).
Sanders, J.M., et al., "Scalable, compact, nanosecond pulse generator with a high repetition rate for biomedical applications requiring intense electric fields," 2009 IEEE Pulsed Power Conference, Washington, DC, 2 pages (Jun. 28, 2009-Jul. 2, 2009) (Abstract).

(56) References Cited

OTHER PUBLICATIONS

Schamiloglu, E., et al., "Scanning the Technology: Modern Pulsed Power: Charlie Martin and Beyond," Proceedings of the IEEE, vol. 92, No. 7 , pp. 1014-1020 (Jul. 2004).

Scoville, J.T., et al., "The Resistive Wall Mode Feedback Control System on DIII-D," IEEE/NPSS 18th Symposium on fusion Engineering, Albuquerque, NM, Oct. 25-29, 1999, General Atomics Report GAA23256, 7 pages (Nov. 1999).

Singleton, D.R., et al., "Compact Pulsed-Power System for Transient Plasma Ignition," IEEE Transactions on Plasma Science, vol. 37, No. 12, pp. 2275-2279 (2009) (Abstract).

Singleton, D.R., et al., "Low Energy Compact Power Modulators for Transient Plasma Ignition," IEEE Transactions on Dielectrics and Electrical Insulation, vol. 18, No. 4, pp. 1084-1090 (Aug. 2011) (Abstract).

Starikovskiy, A., and Aleksandrov, N., "Plasma-assisted ignition and combustion," Progress in Energy and Combustion Science, vol. 39, No. 1, pp. 61-110 (Feb. 2013).

Wang, F., et al., "Compact High Repetition Rate Pseudospark Pulse Generator," IEEE Transactions on Plasma Science, vol. 33, No. 4, pp. 1177-1181 (Aug. 2005) (Abstract).

Zavadtsev, D.A., et al., "Compact Electron Linear Accelerator RELUS-5 for Radiation Technology Application," 10th European Particle Accelerator Conference, Edinburgh, UK, pp. 2385-2387 (Jun. 26-30, 2006).

Zhu, Z., et al., "High Voltage pulser with a fast fall-time for plasma immersion ion implantation," Review of Scientific Instruments, vol. 82, No. 4, pp. 045102-1-045102-4 (Apr. 2011).

International Search Report and Written Opinion as issued in connection with International Patent Application No. PCT/US2014/040929, mailed Sep. 15, 2014, 10 pages.

International Search Report and Written Opinion as issued in connection with International Patent Application No. PCT/US2014/065832, mailed Feb. 20, 2015, 13 pages.

International Search Report and Written Opinion as issued in connection with International Patent Application No. PCT/US2015/018349, mailed Jul. 14, 2015, 15 pages.

International Search Report and Written Opinion as issued in connection with International Patent Application No. PCT/US2015/040204, mailed Oct. 6, 2015, 12 pages.

Non-Final Office Action in U.S. Appl. No. 14/542,487 dated Nov. 23, 2015, 11 pages.

Non-Final Office Action in U.S. Appl. No. 14/798,154 dated Jan. 5, 2016, 13 pages.

Final Office Action in U.S. Appl. No. 14/542,487 dated Feb. 12, 2016, 11 pages.

Non-Final Office Action in U.S. Appl. No. 14/542,487 dated Apr. 8, 2016, 12 pages.

Non Final Office Action in U.S. Appl. No. 14/635,991, dated Jul. 29, 2016, 17 pages.

Final Office Action in U.S. Appl. No. 14/798,154 dated Oct. 6, 2016, 14 pages.

Final Office Action in U.S. Appl. No. 14/542,487 dated Dec. 12, 2016, 13 pages.

Final Office Action in U.S. Appl. No. 14/635,991, dated Jan. 23, 2017, 22 pages.

Advisory Action in U.S. Appl. No. 14/542,487 dated Mar. 28, 2017, 03 pages.

Notice of Allowance in U.S. Appl. No. 14/635,991, dated May 4, 2017, 07 pages.

Non-Final Office Action in U.S. Appl. No. 14/798,154 dated May 26, 2017, 16 pages.

Non-Final Office Action in U.S. Appl. No. 14/542,487 dated Jun. 5, 2017, 12 pages.

Partial Supplementary European Search Report received Jul. 28, 2017 in related foreign application No. 14861818.4, 12 Pages.

Non Final Office Action in U.S. Appl. No. 15/623,464, dated Nov. 7, 2017, 18 pages.

Final Office Action in U.S. Appl. No. 14/542,487 dated Dec. 19, 2017, 07 pages.

Final Office Action in U.S. Appl. No. 14/798,154 dated Dec. 28, 2017, 06 pages.

Notice of Allowance in U.S. Appl. No. 14/542,487 dated Mar. 21, 2018, 05 pages.

Final Office Action in U.S. Appl. No. 15/623,464, dated Mar. 27, 2018, 18 pages.

International Search Report and Written Opinion as issued in connection with International Patent Application No. PCT/US2018/016993, mailed Apr. 18, 2018, 11 pages.

Non-Final Office Action in U.S. Appl. No. 15/889,586 dated Sep. 12, 2018, 18 pages.

Notice of Allowance in U.S. Appl. No. 14/798,154 dated Jun. 1, 2018, 05 pages.

Non Final Office Action in U.S. Appl. No. 16/779,270, dated Jul. 16, 2020, 9 pages.

Notice of Allowance in U.S. Appl. No. 16/524,967, dated Jul. 17, 2020, 11 pages.

Final Office Action in U.S. Appl. No. 16/599,318, dated Jul. 23, 2020, 14 pages.

Notice of Allowance in U.S. Appl. No. 16/599,318, dated Aug. 4, 2020, 8 pages.

Notice of Allowance in U.S. Appl. No. 16/779,270, dated Aug. 10, 2020, 6 pages.

Non Final Office Action in U.S. Appl. No. 16/537,513, dated Sep. 3, 2020, 13 pages.

Non-Final Office Action in U.S. Appl. No. 15/889,586 dated Sep. 18, 2020, 19 pages.

International Search Report and Written Opinion as issued in connection with International Patent Application No. PCT/US2020/040579, mailed Sep. 30, 2020, 10 pages.

Notice of Allowance in U.S. Appl. No. 16/523,840, dated Sep. 30, 2020, 11 pages.

Notice of Allowance in U.S. Appl. No. 16/779,270, dated Oct. 8, 2020, 5 pages.

International Search Report and Written Opinion as issued in connection with International Patent Application No. PCT/US2020/034427, mailed Oct. 16, 2020, 9 pages.

Notice of Allowance in U.S. Appl. No. 16/524,950, dated Oct. 19, 2020, 9 pages.

Notice of Allowance in U.S. Appl. No. 16/524,950, dated Nov. 16, 2020, 9 pages.

Non Final Office Action in U.S. Appl. No. 16/903,374, dated Nov. 25, 2020, 16 pages.

Final Office Action in U.S. Appl. No. 16/722,115, dated Dec. 2, 2020, 7 pages.

Notice of Allowance in U.S. Appl. No. 16/523,840, dated Dec. 4, 2020, 11 pages.

Final Office Action in U.S. Appl. No. 16/537,513, dated Jan. 7, 2021, 12 pages.

Notice of Allowance in U.S. Appl. No. 16/555,948, dated Jan. 13, 2021, 7 pages.

Notice of Allowance in U.S. Appl. No. 16/524,926, dated Jan. 15, 2021, 9 pages.

Notice of Allowance in U.S. Appl. No. 16/457,791 dated Jan. 22, 2021, 7 pages.

International Search Report and written opinion received for PCT Patent Application No. PCT/US2020/60799, mailed in Feb. 5, 2021, 11 pages.

Notice of Allowance in U.S. Appl. No. 16/697,173, dated Feb. 9, 2021, 13 pages.

Notice of Allowance in U.S. Appl. No. 16/848,830, dated Feb. 19, 2021, 8 pages.

Extended European Search Report for Application No. 20195265.2 received Mar. 17, 2021, 8 pages.

Notice of Allowance in U.S. Appl. No. 16/722,115, dated Apr. 1, 2021, 9 pages.

Notice of Allowance in U.S. Appl. No. 15/889,586 dated Apr. 14, 2021, 9 pages.

Non Final Office Action in U.S. Appl. No. 16/941,532, dated Apr. 14, 2021, 10 pages.

Advisory Action in U.S. Appl. No. 16/537,513, dated Apr. 22, 2021, 5 pages.

(56)        References Cited

OTHER PUBLICATIONS

Notice of Allowance in U.S. Appl. No. 16/721,396, dated Apr. 23, 2021, 10 pages.
Extended European Search Report for Application No. 20200919.7 received Apr. 30, 2021, 11 pages.
Non-Final Office Action in U.S. Appl. No. 16/722,115, dated May 3, 2021, 9 pages.
International Search Report and Written Opinion as issued in connection with International Patent Application No. PCT/US2020/066990, mailed May 5, 2021, 9 pages.
Notice of Allowance in U.S. Appl. No. 16/848,830, dated May 13, 2021, 6 pages.
Non-Final Office Action in U.S. Appl. No. 15/889,586 dated Jun. 11, 2021, 11 pages.
Notice of Reason for Refusal for JP Patent Application No. 2021-504454, mailed on Jul. 20, 2021, 8 pages.
International Preliminary Report On Patentability dated Jul. 27, 2021 in PCT Application No. PCT/US2020/016253, 06 pages.
Non-Final Office Action in U.S. Appl. No. 16/937,948, dated Aug. 24, 2021, 10 pages.
Restriction Requirement in U.S. Appl. No. 17/133,612, dated Aug. 26, 2021, 5 pages.
Non Final Office Action in U.S. Appl. No. 17/231,931, dated Sep. 9, 2022, 13 pages.
Non Final Office Action in U.S. Appl. No. 16/919,085, dated Sep. 29, 2021, 19 pages.
Notice of Allowance in U.S. Appl. No. 16/722,115 dated Oct. 4, 2021, 9 pages.
Notice of Allowance in U.S. Appl. No. 16/537,513, dated Oct. 8, 2021, 10 pages.
Final Office Action in U.S. Appl. No. 16/937,948, dated Nov. 22, 2021, 05 pages.
Final Office Action in U.S. Appl. No. 16/919,085, dated Jan. 18, 2022, 23 pages.
Non-Final Office Action in U.S. Appl. No. 17/133,612 dated Feb. 1, 2022, 7 pages.
Non Final Office Action in U.S. Appl. No. 17/366,000, dated Mar. 3, 2022, 8 pages.
Notice of Allowance in U.S. Appl. No. 16/937,948 dated Apr. 28, 2022, 6 pages.
Non-Final Office Action in U.S. Appl. No. 17/359,498, dated Jun. 29, 2022, 7 pages.
Final Office Action in U.S. Appl. No. 17/366,000, dated Sep. 6, 2022, 8 pages.
Notice of Allowance in U.S. Appl. No. 17/133,612 dated Sep. 8, 2022, 10 pages.
First Office Action in CN Patent application No. 202080048240.2 dated Jun. 27, 2024, 22 pages.
Office Action in TW Patent application No. 112101449 dated Jul. 5, 2024, 11 pages.
Non-Final Office Action in U.S. Appl. No. 17/214,772, dated Sep. 5, 2024, 10 pages.
Notice of Allowance in U.S. Appl. No. 18/328,411, dated Sep. 30, 2024, 9 pages.
International Search Report and Written Opinion as issued in connection with International Patent Application No. PCT/US2018/025440, mailed Jun. 25, 2018, 13 pages.
Notice of Allowance in U.S. Appl. No. 15/623,464, dated Oct. 17, 2018, 7 pages.
International Search Report and Written Opinion as issued in connection with International Patent Application No. PCT/US2018/048206, mailed Nov. 1, 2018, 10 pages.
Non Final Office Action in U.S. Appl. No. 15/941,731, dated Nov. 16, 2018, 17 pages.
Non-Final Office Action in U.S. Appl. No. 15/921,650 dated Nov. 28, 2018, 11 pages.
Non Final Office Action in U.S. Appl. No. 16/178,538, dated Jan. 11, 2019, 27 pages.
Non Final Office Action in U.S. Appl. No. 16/250,765, dated Mar. 29, 2019, 11 pages.

Notice of Allowance in U.S. Appl. No. 16/114,195, dated Apr. 3, 2019, 9 pages.
Notice of Allowance in U.S. Appl. No. 15/921,650 dated Apr. 4, 2019, 7 pages.
Non Final Office Action in U.S. Appl. No. 16/178,565, dated Apr. 4, 2019, 10 pages.
Final Office Action in U.S. Appl. No. 15/889,586 dated May 2, 2019, 19 pages.
Final Office Action in U.S. Appl. No. 15/941,731, dated May 3, 2019, 16 pages.
Final Office Action in U.S. Appl. No. 16/178,538 dated Jun. 7, 2019, 17 pages.
Notice of Allowance in U.S. Appl. No. 16/250,765, dated Jul. 10, 2019, 9 pages.
Final Office Action in U.S. Appl. No. 16/178,565, dated Jul. 12, 2019, 11 pages.
Notice of Allowance in U.S. Appl. No. 16/178,538 dated Jul. 17, 2019, 10 pages.
Notice of Allowance in U.S. Appl. No. 15/941,731, dated Jul. 17, 2019, 12 pages.
Non-Final Office Action in U.S. Appl. No. 15/889,586 dated Sep. 6, 2019, 17 pages.
International Search Report and Written Opinion as issued in connection with International Patent Application No. PCT/US2019/043933, mailed Oct. 25, 2019, 9 pages.
Notice of Allowance in U.S. Appl. No. 16/178,565, dated Nov. 14, 2019, 5 pages.
Non Final Office Action in U.S. Appl. No. 15/945,722, dated Nov. 15, 2019, 13 pages.
International Search Report and Written Opinion as issued in connection with International Patent Application No. PCT/US2019/043932, mailed Dec. 5, 2019, 16 pages.
International Search Report and Written Opinion as issued in connection with International Patent Application No. PCT/US2019/043988, mailed Dec. 10, 2019, 13 pages.
Non Final Office Action in U.S. Appl. No. 16/250,157 dated Dec. 19, 2019, 6 pages.
International Search Report and Written Opinion as issued in connection with International Patent Application No. PCT/US2019/046067, mailed Jan. 3, 2020, 13 pages.
Notice of Allowance in U.S. Appl. No. 16/525,357, dated Jan. 14, 2020, 8 pages.
Non-Final Office Action in U.S. Appl. No. 16/599,318, dated Jan. 16, 2020, 11 pages.
Non-Final Office Action in U.S. Appl. No. 16/722,085, dated Mar. 6, 2020, 5 pages.
Final Office Action in U.S. Appl. No. 15/889,586 dated Mar. 18, 2020, 18 pages.
Non-Final Office Action in U.S. Appl. No. 16/523,840, dated Mar. 19, 2020, 6 pages.
Restriction Requirement in U.S. Appl. No. 16/537,513, dated Apr. 1, 2020, 7 pages.
Notice of Allowance in U.S. Appl. No. 15/945,722, dated Apr. 3, 2020, 7 pages.
Non-Final Office Action in U.S. Appl. No. 16/736,971, dated Apr. 7, 2020, 14 pages.
International Search Report and Written Opinion as issued in connection with International Patent Application No. PCT/US2019/013988, mailed Apr. 9, 2020, 8 pages.
Notice of Allowance in U.S. Appl. No. 16/250,157 dated Apr. 13, 2020, 8 pages.
Non-Final Office Action in U.S. Appl. No. 16/457,791 dated Apr. 15, 2020, 12 pages.
Non-Final Office Action in U.S. Appl. No. 16/524,950, dated Apr. 16, 2020, 8 pages.
Final Office Action in U.S. Appl. No. 16/736,971, dated Apr. 17, 2020, 6 pages.
International Search Report and Written Opinion as issued in connection with International Patent Application No. PCT/US2020/016253, mailed Apr. 29, 2020, 7 pages.
Restriction Requirement in U.S. Appl. No. 16/524,967, dated Apr. 29, 2020, 6 pages.

(56)          References Cited

OTHER PUBLICATIONS

Advisory Action in U.S. Appl. No. 16/736,971, dated May 12, 2020, 5 pages.

Non-Final Office Action in U.S. Appl. No. 16/722,115, dated May 14, 2020, 6 pages.

Non-Final Office Action in U.S. Appl. No. 16/555,948, dated May 15, 2020, 8 pages.

International Search Report and Written Opinion as issued in connection with International Patent Application No. PCT/US2020/012641, mailed May 28, 2020, 15 pages.

Extended European Search Report for Application No. 18848041.2 received Jun. 23, 2020, 9 pages.

Non Final Office Action in U.S. Appl. No. 16/697,173, dated Jun. 26, 2020, 19 pages.

Final Office Action in U.S. Appl. No. 16/523,840, dated Jun. 26, 2020, 5 pages.

Notice of Allowance in U.S. Appl. No. 16/736,971, dated Jun. 30, 2020, 14 pages.

Advisory Action in U.S. Appl. No. 15/889,586 dated Jul. 10, 2020, 4 pages.

Notice of Allowance in U.S. Appl. No. 16/722,085, dated Jul. 16, 2020, 8 pages.

* cited by examiner

HIGH FREQUENCY RF GENERATOR AND DC PULSING

BACKGROUND

Some plasma systems include at least two power supplies. One that produces high frequency waveforms that can be used to create a plasma within the plasma chamber. The other produces high voltage pulses that accelerate charged plasma particles toward a wafer within the plasma chamber. These two power supplies are typically separate and distinct from each other.

SUMMARY

A power supply is disclosed. In some embodiments, the power supply may include a high voltage power supply; a nanosecond pulser electrically coupled with the high voltage power supply that switches voltage from the high voltage power supply at high frequencies; a transformer having a primary side and a secondary side, the nanosecond pulser electrically coupled with the primary side of the transformer; and an output electrically coupled with the transformer producing a waveform, the waveform. The output may include a plurality of high voltage pulses having a pulse amplitude greater than about 2 kV, a pulse width, and a pulse repetition frequency; and a sinusoidal waveform having a waveform frequency and a waveform amplitude greater than 100 V, wherein the waveform amplitude is less than the pulse amplitude; and wherein the pulse repetition frequency is less than the waveform frequency.

In some embodiments, the power supply may include an energy recovery circuit electrically coupled with the secondary side of the transformer. The energy recovery circuit may include an energy recovery inductor electrically coupled with the high voltage power supply; a crowbar diode arranged in parallel with the secondary side of the transformer; and a second diode disposed in series with the energy recovery inductor and arranged to conduct current from a load through the energy recovery inductor to the high voltage power supply.

In some embodiments, the waveform frequency is greater than about 10 MHz.

In some embodiments, the power supply comprises stray inductance and stray capacitance, wherein the waveform frequency and/or the waveform amplitude are dependent at least in part on either or both the stray inductance and the stray capacitance.

In some embodiments, the waveform frequency and/or the waveform amplitude are dependent at least in part on the pulse width.

In some embodiments, the power supply comprises stray inductance having an inductance less than about 1.8 μH. In some embodiments, the power supply comprises stray inductance having an inductance less than about 400 nH. In some embodiments, the power supply comprises stray capacitance having a capacitance less than about 20 nF.

In some embodiments, the output is coupled with a plasma chamber, wherein the sinusoidal waveform creates a plasma within the plasma chamber and the plurality of high voltage pulses accelerate plasma particles within the plasma chamber.

In some embodiments, the pulse amplitude is greater than about 5 kV, and wherein each of the plurality of high frequency pulses have a pulse rise time that is less than about 20 ns.

A power supply is disclosed. In some embodiments, the power supply may include a high voltage power supply; a nanosecond pulser electrically coupled with the high voltage power supply and switches voltage from the high voltage power supply at high frequencies; a transformer having a primary side and a secondary side, the nanosecond pulser electrically coupled with the primary side of the transformer; an output electrically coupled with the transformer producing a waveform. The waveform may include a plurality of high voltage pulses having a pulse amplitude, a pulse width, and a pulse repetition frequency; and a sinusoidal waveform having a waveform amplitude and a waveform frequency. The power supply may have a stray capacitance measured from the output having a capacitance less than about 20 nF and/or a stray inductance measured from the output having an inductance less than about 400 nH.

In some embodiments, the waveform frequency and/or the waveform amplitude are dependent at least in part on either or both the stray inductance and the stray capacitance.

In some embodiments, the waveform frequency and/or the waveform amplitude are dependent at least in part on the pulse width.

In some embodiments, the pulse amplitude is greater than about 5 kV, and wherein each of the plurality of high frequency pulses have a pulse rise time that is less than about 20 ns.

In some embodiments, the waveform amplitude is less than the pulse amplitude.

In some embodiments, the pulse repetition frequency is less than the waveform frequency.

In some embodiments, the waveform frequency is between about 2 MHz and 20 MHz.

In some embodiments, the power supply may also include an energy recovery circuit electrically coupled with the secondary side of the transformer. The energy recovery circuit may include an energy recovery inductor electrically coupled with the high voltage power supply; a crowbar diode arranged in parallel with the secondary side of the transformer; and a second diode disposed in series with the energy recovery inductor and arranged to conduct current from a load through the energy recovery inductor to the high voltage power supply.

A semiconductor plasma system is also disclosed. The semiconductor plasma system may include a plasma chamber, and a high voltage power supply. The high voltage power supply may include: a high voltage power supply; a nanosecond pulser electrically coupled with the high voltage power supply that switches voltage from the high voltage power supply at high frequencies; a transformer having a primary side and a secondary side, the nanosecond pulser electrically coupled with the primary side of the transformer; and an output electrically coupled with the transformer and the plasma chamber, the output producing a waveform within the plasma chamber. The waveform may include a sinusoidal waveform configured to create a plasma within the plasma chamber, the sinusoidal waveform having a waveform frequency and a waveform amplitude greater than 100 V; and/or a plurality of high voltage pulses that accelerate plasma particles within the plasma chamber, the plurality of high voltage pulses having a pulse amplitude greater than about 2 kV, a pulse width, and a pulse repetition frequency.

In some embodiments, the power supply comprises stray inductance and stray capacitance, wherein the waveform frequency and/or the waveform amplitude are dependent at least in part on either or both the stray inductance and the stray capacitance.

In some embodiments, the waveform frequency and/or the waveform amplitude are dependent at least in part on the pulse width.

In some embodiments, plasma chamber produces a plasma sheath having a sheath capacitance, wherein the waveform frequency and/or the waveform amplitude are dependent on the sheath capacitance.

In some embodiments, the power supply comprises stray inductance having an inductance less than about 400 nH. In some embodiments, the power supply comprises stray capacitance having a capacitance less than about 20 nF. In some embodiments, the pulse amplitude is greater than about 5 kV, and wherein each of the plurality of high frequency pulses have a pulse rise time that is less than about 40 ns.

In some embodiments, the waveform amplitude is less than the pulse amplitude.

In some embodiments, the pulse repetition frequency is less than the waveform frequency. In some embodiments, the waveform frequency is greater than about 10 MHz.

In some embodiments, the power supply further comprises an energy recovery circuit electrically coupled with the secondary side of the transformer. The energy recovery circuit may include an energy recovery inductor electrically coupled with the high voltage power supply; a crowbar diode arranged in parallel with the secondary side of the transformer; and a second diode disposed in series with the energy recovery inductor and arranged to conduct current from a load through the energy recovery inductor to the high voltage power supply. The various embodiments described in the summary and this document are provided not to limit or define the disclosure or the scope of the claims.

DETAILED DESCRIPTION

Some embodiments include a plasma system that introduces both high frequency waveforms and high voltage pulses into a plasma chamber. The high frequency waveforms, for example, can be used to create a plasma within the plasma chamber. The high voltage pulses, for example, can be used to accelerate charged plasma particles toward a wafer within the plasma chamber. In some embodiments, a single nanosecond pulser system can be used to create both the high frequency waveform and the high voltage pulses.

Such a plasma system, for example, using a single power supply can replace both an RF power supply and a pulsed power supply.

In some embodiments the implement an edge ring electrode, a first nanosecond pulser system can be coupled with the main electrode within a plasma chamber and a second nanosecond pulser system can be coupled with the edge ring. In some embodiments, configurations, the second nanosecond pulser system may only produce high voltage pulses. In other configurations, the second nanosecond pulser system may produce both high frequency waveforms and high voltage pulses.

A nanosecond pulser system, for example, can include any power supply that can produce high voltage pulses (e.g., voltages greater than 1 kV, 10 kV, 20 kV, 50 kV, 100 kV, etc.), at high frequencies (e.g., frequencies greater than 1 kHz, 10 kHz, 100 kHz, 200 kHz, 500 kHz, 1 MHz, etc.), with fast rise times (e.g., rise times less than about 1 ns, 10 ns, 50 ns, 100 ns, 250 ns, 500 ns, 1,000 ns, etc.), with fast fall times (e.g., fall times less than about 1 ns, 10 ns, 50 ns, 100 ns, 250 ns, 500 ns, 1,000 ns, etc.) and/or with short pulse widths (e.g., pulse widths less than about 1,000 ns, 500 ns, 250 ns, 100 ns, 20 ns, etc.).

A nanosecond pulser system, for example, may be referred to as a pulse generator, a pulsed bias generator, a nanosecond pulse generator, a square wave generator, etc.

Figure 1:
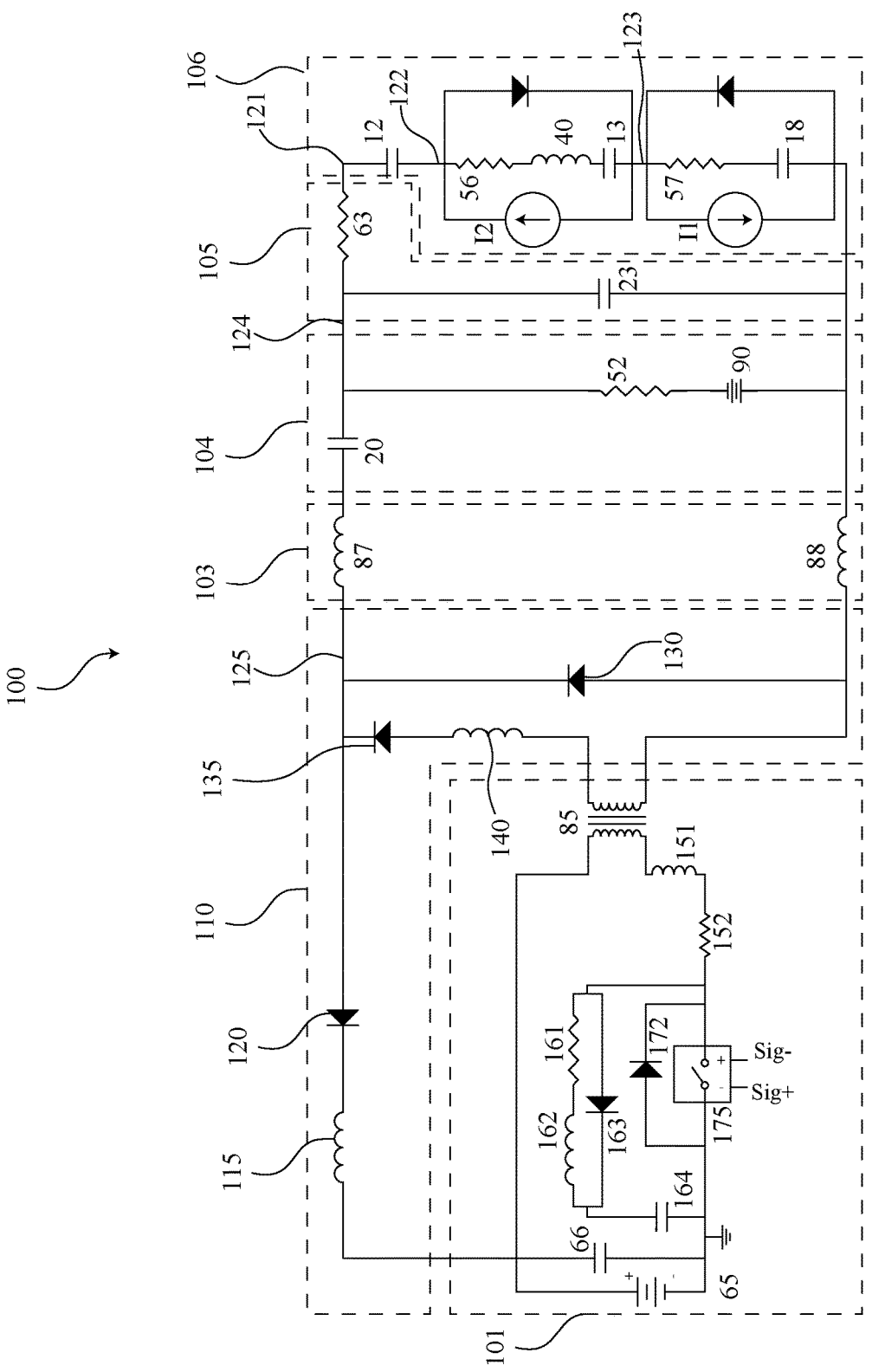
FIG. 1 is a circuit diagram of a nanosecond pulser system with an energy recovery circuit driving a load stage according to some embodiments.

FIG. 1 is a circuit diagram of a nanosecond pulser system 100 driving a load stage 106 according to some embodiments. While a specific load stage 106 is described various other loads may be used.

In some embodiments, the load stage 106 may represent an idealized or effective circuit for semiconductor processing chamber such as, for example, a plasma deposition system, semiconductor fabrication system, plasma sputtering system, etc. The capacitance 12, for example, may represent the capacitance of an electrostatic chuck upon which a semiconductor process wafer may sit. The chuck, for example, may comprise a dielectric material (e.g., aluminum oxide, or other ceramic materials and a conductor housed within the dielectric material). For example, the capacitor 23 may have small capacitance (e.g., about 10 pF, 100 pF, 500 pF, 1 nF, 10 nF, 100 nF, etc.).

The capacitor 13, for example, may represent the sheath capacitance between the plasma to the wafer. The resistor 56, for example, may represent the sheath resistance between the plasma and the wafer. The inductor 40, for example, may represent the sheath inductance between the plasma and the wafer. The current source I2, for example, may be represent the ion current through the sheath. For example, the capacitor 23 or the capacitor 13 may have small capacitance (e.g., about 10 pF, 100 pF, 500 pF, 1 nF, 10 nF, 100 nF, etc.).

The capacitor 18, for example, may represent the plasma sheath capacitance to the wall of the chamber. The resistor 57, for example, may represent resistance between the plasma and the chamber wall. The current source I1, for example, may be representative of the ion current in the plasma. For example, the capacitor 23 or the capacitor 18 may have small capacitance (e.g., about 10 pF, 100 pF, 500 pF, 1 nF, 10 nF, 100 nF, etc.).

In some embodiments, the plasma voltage may be the voltage measured from ground to circuit point 123; the wafer voltage is the voltage measured from ground to circuit point 122 and may represent the voltage at the surface of the wafer; the chucking voltage is the voltage measured from ground to circuit point 121; the electrode voltage is the voltage measure from ground to circuit point labeled 124

(e.g., on the electrode); and the input voltage is the voltage measured from ground to circuit point 125.

In this example, the DC bias circuit 104 does not include any bias compensation. The DC bias circuit 104 includes an offset supply voltage 90 that may, for example, bias the output voltage either positively or negatively. In some embodiments, the offset supply voltage 90, can be adjusted to change the potential between the wafer voltage and the chuck voltage. In some embodiments, offset supply voltage 90 can have a voltage of about ±5 kV, ±4 kV, ±3 kV, ±2, kV, ±1 kV, etc.

In some embodiments, the bias capacitor 20 can isolate (or separate) the DC bias voltage from other circuit elements. The bias capacitor 20, for example, may allow for a potential shift from one portion of the circuit to another. In some embodiments, this potential shift may ensure that the electrostatic force holding the wafer in place on the chuck remains below the voltage threshold. The resistor 52 may isolate the DC bias supply from the high voltage pulsed output from the nanosecond pulser stage 101.

The bias capacitor 20, for example, may have a capacitance less than about 100 pF, 10 pF, 1 pF, 100 µF, 10 µF, 1 µF, etc. The resistor 52, for example, may have a high resistance such as, for example, a resistance of about 1 kOhm, 10 kOhm, 100 kOhm, 1 MOhm, 10 MOhm, 100 MOhm, etc.

The resistor R13, for example, may represent the resistance of the leads or transmission lines that connect from the output of the high voltage power system to the electrode (e.g., the load stage 106). There may also be stray capacitance in the leads or transmissions line.

In some embodiments, the nanosecond pulser stage 101 may produce pulses with high pulse voltage (e.g., voltages greater than 1 kV, 10 kV, 20 kV, 50 kV, 100 kV, etc.), high frequencies (e.g., frequencies greater than 1 kHz, 10 kHz, 100 kHz, 200 kHz, 500 kHz, 1 MHz, etc.), fast rise times (e.g., rise times less than about 1 ns, 10 ns, 50 ns, 100 ns, 250 ns, 500 ns, 1,000 ns, etc.), fast fall times (e.g., fall times less than about 1 ns, 10 ns, 50 ns, 100 ns, 250 ns, 500 ns, 1,000 ns, etc.) and/or short pulse widths (e.g., pulse widths less than about 1,000 ns, 500 ns, 250 ns, 100 ns, 20 ns, etc.).

For example, the nanosecond pulser stage 101 may include all or any portion of any device described in U.S. patent application Ser. No. 14/542,487, titled "High Voltage Nanosecond Pulser," which is incorporated into this disclosure for all purposes, or all or any portion of any device described in U.S. patent application Ser. No. 14/635,991, titled "Galvanically Isolated Output Variable Pulse Generator Disclosure," which is incorporated into this disclosure for all purposes, or all or any portion of any device described in U.S. patent application Ser. No. 14/798,154, titled "High Voltage Nanosecond Pulser With Variable Pulse Width and Pulse Repetition Frequency," which is incorporated into this disclosure for all purposes.

In some embodiments, the nanosecond pulser stage 101 may include one or more nanosecond pulsers coupled together in any number of ways.

In some embodiments, the nanosecond pulser stage 101 may include a DC power supply providing a consistent DC voltage that is switched by switch 175 and provides the switched power to the transformer 85. The DC power supply may include a offset supply voltage 90 and an energy storage capacitor 66. If the transformer 85 has a 1:10 turn ratio, then the transformer may produce 10 kV on the load.

In some embodiments, if the load capacitance (e.g., capacitance 13 and capacitance 18) is small in comparison with the capacitance of the energy storage capacitor 66, voltage doubling may (or may not) occur at the transformer input. For example, if the energy storage capacitor 66 provides 500 V, then 1 kV may be measured at the input of the transformer 85.

The switch 175, for example, may include one or more solid state switches such as, for example, an IGBT, a MOSFET, a SiC MOSFET, SiC junction transistor, FETs, SiC switches, GaN switches, photoconductive switch, etc. The switch 175 may be switched based on a signal from a controller labeled Sig+ and Sig–.

In some embodiments, the nanosecond pulser stage 101 may include snubber circuit that may include any type of snubber circuit. In some embodiments, the snubber circuit may include a capacitor. In some embodiments, the snubber circuit may include a capacitor and a resistor. In some embodiments, the snubber circuit may include a capacitor, an inductor, and a resistor In some embodiments, the snubber circuit may include snubber resistor 161 in parallel with snubber diode 163, and a snubber capacitor 164. The snubber circuit may also include stray inductance. In some embodiments, the snubber resistor 161 and/or the snubber diode 163 may be placed between the collector of switch 175 and the primary winding of the transformer 85. The snubber diode 163 may be used to snub out any over voltages in the switching. A large and/or fast capacitor may be coupled on the emitter side of the switch 175. The freewheeling diode 172 may also be coupled with the emitter side of the switch 65. Various other components may be included that are not shown in the figures. One or more switches and or circuits can be arranged in parallel or series.

In some embodiments, the switch 175 may switch so fast that the switched voltage may never be at full voltage (e.g., the voltage of the energy storage capacitor 66 and/or the offset supply voltage 90). In some embodiments, a gate resistor coupled with the switch 175 may be set with short turn on pulses.

In some embodiments, the nanosecond pulser stage 101 may include a freewheeling diode 172. In some embodiments, the freewheeling diode 172 may be used in combination with inductive loads to ensure that energy stored in the inductive load may be allowed to dissipate after the switch 175 is opened by allowing current to keep flowing in the same direction through the inductor and energy is dissipated in the resistive elements of the circuit. If a freewheeling diode 172 is not included, then this can, for example, lead to a large reverse voltage on the switch 175.

In some embodiments, the nanosecond pulser stage 101 may include stray inductance 151 and/or stray resistance 152. The stray inductance 151, for example, may be less than about 10 nH, 100 nH, 1,000 nH, 10,000 nH, etc. The stray resistance 152, for example, may be less than about 1 Ohm, 100 mOhm, 10 mOhm, etc.

In some embodiments, the energy recovery circuit 110 may be electrically coupled with the secondary side of the transformer and/or with the energy storage capacitor 66. The energy recovery circuit 110, for example, may include a diode 130 (e.g., a crowbar diode) across the secondary side of the transformer 85. The energy recovery circuit 110, for example, may include energy recovery diode 120 and the energy recovery inductor 115 (arranged in series), which can allow current to flow from the secondary side of the transformer 85 to charge the energy storage capacitor 66. The energy recovery diode 120 and the energy recovery inductor 115 may be electrically connected with the secondary side of the transformer 85 and the energy storage capacitor 66. In some embodiments, the energy recovery circuit 110 may include diode 130 and/or inductor 140 electrically coupled with the secondary of the transformer 85. The inductor 140 may represent the stray inductance and/or may include the stray inductance of the transformer 85.

In some embodiments, the energy recovery inductor 115 may include any type of inductor such as, for example, a ferrite core inductor or an air core inductor. In some embodiments, the energy recovery inductor 115 may have any type of geometry such as, for example, a solenoidal winding, a toroidal winding, etc. In some embodiments, the energy recovery inductor 115 may have an inductance greater then about 10 pH, 50 pH, 100 pH, 500 pH, etc.

In some embodiments, the energy recovery inductor 115 may have an inductance of about 1 µH to about 100 mH.

In some embodiments, when the nanosecond pulser is turned on, current may charge the load stage 106 (e.g., charge the capacitor 13, capacitor 12, or capacitor 18). Some current, for example, may flow through energy recovery inductor 115 when the voltage on the secondary side of the transformer 85 rises above the charge voltage on the energy storage capacitor 66. When the nanosecond pulser is turned off, current may flow from the capacitors within the load stage 106 (e.g., capacitor 52) through the energy recovery inductor 115 to charge the energy storage capacitor 66 until the voltage across the energy recovery inductor 115 is zero. The diode 130 may prevent the capacitors within the load stage 106 from ringing with the inductance in the load stage 106 or the DC bias circuit 104.

The energy recovery diode 120 may, for example, prevent charge from flowing from the energy storage capacitor 66 to the capacitors within the load stage 106.

The value of energy recovery inductor 115 can be selected to control the current fall time. In some embodiments, the energy recovery inductor 115 can have an inductance value between 1 µH-600 µH. In some embodiments, the energy recovery inductor 115 can have an inductance value greater than 50 µH. In some embodiments, the energy recovery inductor 115 may have an inductance less than about 50 µH, 100 µH, 150 µH, 200 µH, 250 µH, 300 µH, 350 µH, 350 µH, 400 µH, 400 µH, 500 µH, etc.

For example, if the energy storage capacitor 66 provides 500 V, then 1 kV will be measured at the input of the transformer 85 (e.g., as noted above due to voltage doubling). The 1 kV at the transformer 85 may be divided among the components of the energy recovery circuit 110 when the switch 175 is open. If the values are chosen appropriately (e.g., inductor 162 has an inductance less than the inductance of energy recovery inductor 115), the voltage across the energy recovery diode 120 and the energy recovery inductor 115 may be greater than 500 V. Current may then flow through energy recovery diode 120 and/or charge the energy storage capacitor 66. Current may also flow through diode D3 and inductor 88. Once the energy storage capacitor 66 is charged, the current may no longer flow through diode D3 and energy recovery inductor 115.

In some embodiments, the energy recovery circuit 110 may transfer energy (or transfer charge) from the load stage 106, for example, on fast time scales (e.g., 1 ns, 10 ns, 50 ns, 100 ns, 250 ns, 500 ns, 1,000 ns, etc. time scales). The stray resistance of the energy recovery circuit may be low to ensure the pulse across the load stage 106 has a fast fall time tf. The stray resistance of the energy recovery circuit 110, for example, may have a resistance less than about 1 Ohm, 100 mOhm, 10 mOhm, etc. In some embodiments, the energy transfer efficiency from the load stage 106 may be high such as, for example, greater than about 60%, 70%, 80%, or 90%, etc.

Any number of components shown in FIG. 1 may or may not be required such as, for example, the diode 135 or the diode 130 or the inductor 140.

In some embodiments, a diode may be placed between the voltage source 65 and the point where the energy recovery circuit 110 connects with the voltage source 65 and/or the energy storage capacitor 66. This diode, for example, may be arranged to allow current to flow from the voltage source 65 to the energy storage capacitor 66 but may not allow current to flow from the energy recovery circuit to the energy storage capacitor 66.

In some embodiments, the energy recovery circuit 110 may be removed. In some embodiments, a resistive output stage or a bias compensation circuit may be included. Various other circuits or circuit elements may be included.

In some embodiments, a different load stage 106 may be used. In some embodiments, the load stage may include a capacitively coupled plasma or an inductively coupled plasma.

In some embodiments, the nanosecond pulser system 100 may output a waveform to the load stage 106. The waveform may include a plurality of high voltage pulses and a sinusoidal waveform between the high voltage pulses. The high voltage pulse, for example, may have a pulse amplitude greater than about 2 kV, a pulse width, and a pulse repetition frequency. The sinusoidal waveform may have a waveform frequency and a waveform amplitude greater than 100 V.

In some embodiments, the waveform frequency and/or the waveform amplitude may be dependent at least in part on either or both the stray inductance and the stray capacitance of the nanosecond pulser system 100. The stray inductance, for example, may substantially depend on the inductance of inductor 87 and/or inductor 88. As another example, the inductance of inductor 87 and/or inductor 88 may be between about 50 nH and about 1.8 µH. As another example, the inductance of inductor 87 and/or inductor 88 may be between about 5 nH and about 20 µH. The stray capacitance, for example, may substantially depend on the capacitance of capacitor 52. The capacitance of capacitor 52, for example, may be between about 250 pF to about 1.5 nF. As another example, the capacitance of capacitor 52, may be between about 50 pF to about 20 nF.

The total stray capacitance of the circuit may about 50 pF to about 20 nF. The total stray inductance of the circuit may about 5 nH and about 20 µH.

In some embodiments, the waveform frequency and/or the waveform amplitude may substantially depend at least in part on the pulse width.

Figure 2:
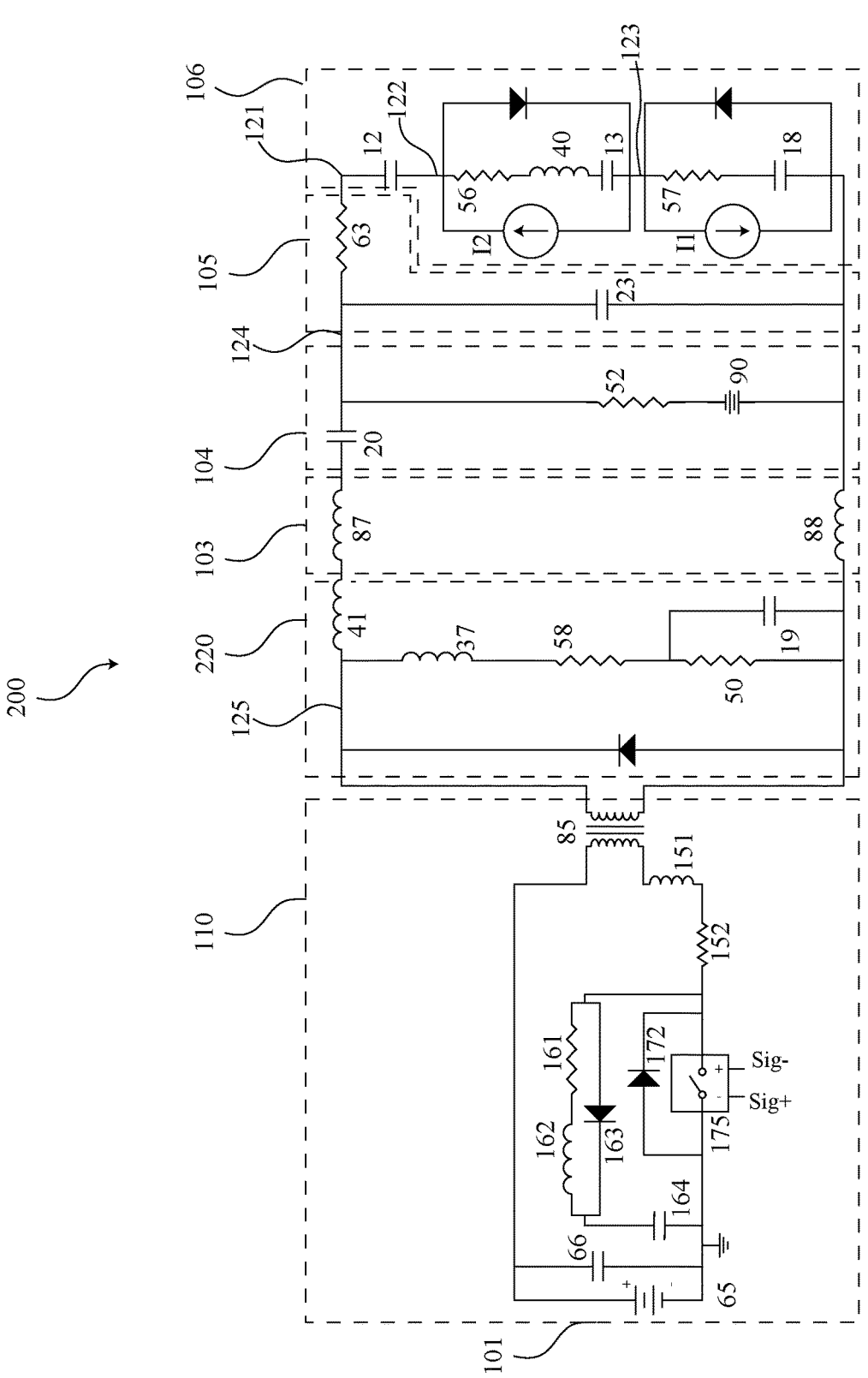
FIG. 2 is a circuit diagram of a nanosecond pulser system with a resistive output stage driving a load stage according to some embodiments.

FIG. 2 is a circuit diagram of a nanosecond pulser system 200 with a resistive output stage 220 driving a load stage according to some embodiments. In this example, the energy recovery circuit 110 is removed from the nanosecond pulser system 100 and is replaced by the resistive output stage 220.

The resistive output stage 220 may include any resistive output stage known in the art. For example, the resistive output stage 220 may include any resistive output stage described in U.S. patent application Ser. No. 16/178,538 titled "HIGH VOLTAGE RESISTIVE OUTPUT STAGE CIRCUIT," which is incorporated into this disclosure in its entirety for all purposes.

For example, the resistive output stage 220 may include an inductor 37, resistor 50, resistor 50, and capacitor 19. In some embodiments, inductor 37 may include an inductance of about 5 µH to about 25 µH. In some embodiments, the resistor 50 may include a resistance of about 50 ohms to about 250 ohms. In some embodiments, the resistor 50 may comprise the stray resistance in the resistive output stage 220.

In some embodiments, the resistor 50 may include a plurality of resistors arranged in series and/or parallel. The capacitor 19 may represent the stray capacitance of the resistor 50 including the capacitance of the arrangement series and/or parallel resistors. The capacitance of stray capacitance 19, for example, may be less than 500 pF, 250 pF, 100 pF, 50 pF, 10 pF, 1 pF, etc. The capacitance of stray capacitance 19, for example, may be less than the load capacitance such as, for example, less than the capacitance of 12, 13, and/or 18.

In some embodiments, the resistor 50 may discharge the load (e.g., a plasma sheath capacitance). In some embodiments, the resistive output stage 220 may be configured to discharge over about 1 kilowatt of average power during each pulse cycle and/or a joule or less of energy in each pulse cycle. In some embodiments, the resistance of the resistor 50 in the resistive output stage 220 may be less than 200 ohms. In some embodiments, the resistor 50 may comprise a plurality of resistors arranged in series or parallel having a combined capacitance less than about 200 pF (e.g., 19).

In some embodiments, the resistive output stage 220 may include a collection of circuit elements that can be used to control the shape of a voltage waveform on a load. In some embodiments, the resistive output stage 220 may include passive elements only (e.g., resistors, capacitors, inductors, etc.). In some embodiments, the resistive output stage 220 may include active circuit elements (e.g., switches) as well as passive circuit elements. In some embodiments, the resistive output stage 220, for example, can be used to control the voltage rise time of a waveform and/or the voltage fall time of waveform.

In some embodiments, the resistive output stage 220 can discharge capacitive loads (e.g., a wafer and/or a plasma). For example, these capacitive loads may have small capacitance (e.g., about 10 pF, 100 pF, 500 pF, 1 nF, 10 nF, 100 nF, etc.).

In some embodiments, a resistive output stage 220 can be used in circuits with pulses having a high pulse voltage (e.g., voltages greater than 1 kV, 10 kV, 20 kV, 50 kV, 100 kV, etc.) and/or high frequencies (e.g., frequencies greater than 1 kHz, 10 kHz, 100 kHz, 200 kHz, 500 kHz, 1 MHz, etc.) and/or frequencies of about 400 kHz, 0.5 MHz, 2.0 MHz, 4.0 MHz, 13.56 MHz, 27.12 MHz, 40.68 MHz, 50 MHz, etc.

In some embodiments, the resistive output stage 220 may be selected to handle high average power, high peak power, fast rise times and/or fast fall times. For example, the average power rating might be greater than about 0.5 kW, 1.0 kW, 10 kW, 25 kW, etc., and/or the peak power rating might be greater than about 1 kW, 10 kW, 100 kW, 1 MW, etc.

In some embodiments, the resistive output stage 220 may include a series or parallel network of passive components. For example, the resistive output stage 220 may include a series of a resistor, a capacitor, and an inductor. As another example, the resistive output stage 220 may include a capacitor in parallel with an inductor and the capacitor-inductor combination in series with a resistor. For example, 37 can be chosen large enough so that there is no significant energy injected into the resistive output stage 220 when there is voltage out of the rectifier. The values of 50 and 50 can be chosen so that the L/R time can drain the appropriate capacitors in the load faster than the RF frequency.

Figure 3:
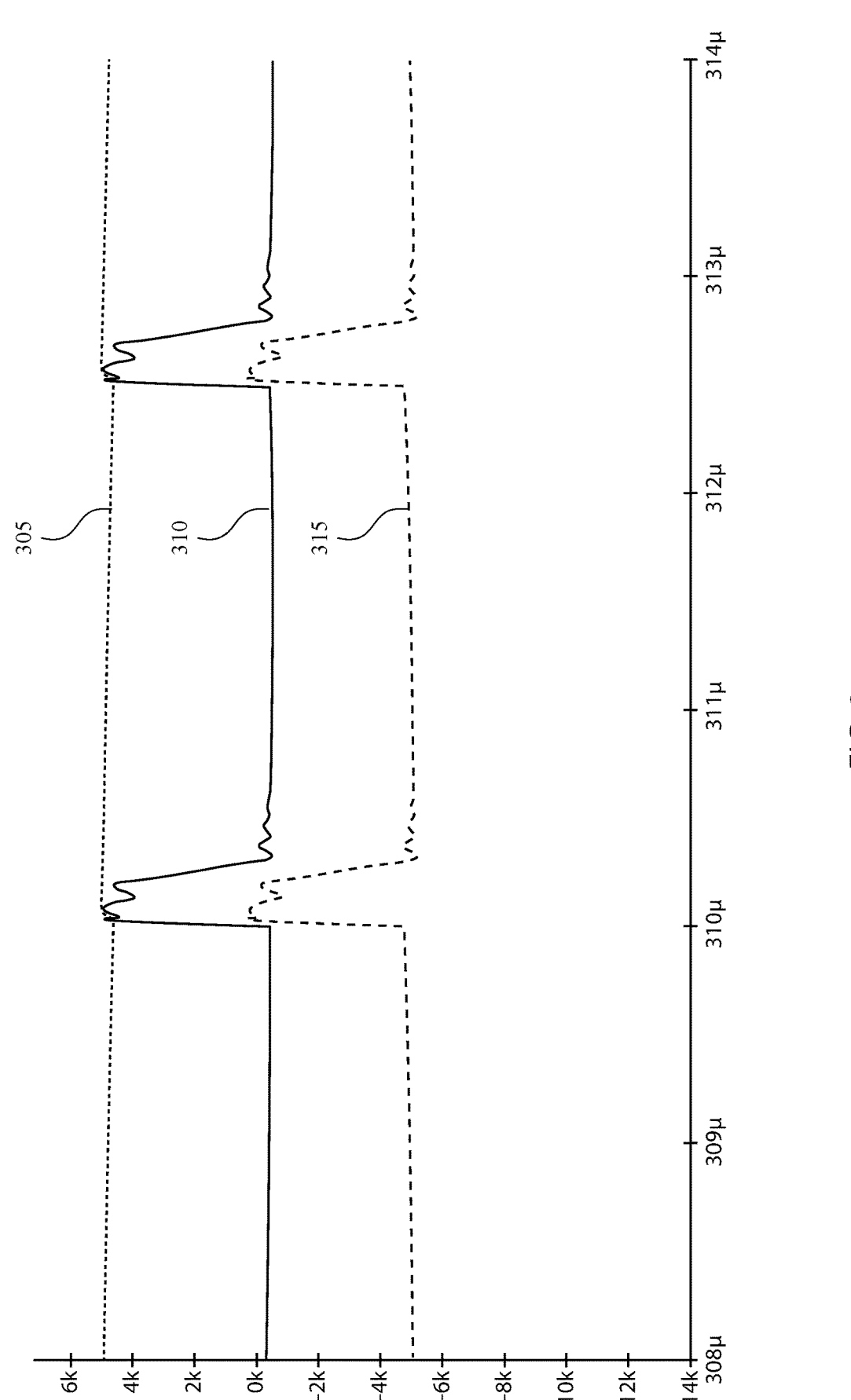
FIG. 3 shows three waveforms produced by the nanosecond pulser system according to some embodiments.

FIG. 3 shows three waveforms produced by the nanosecond pulser system 100 according to some embodiments. The waveform 310 is measured at the point 124 and the waveform 315 is measured at the point 122 (the wafer waveform). The waveform 305 is the difference between the waveform measured at point 121 and the waveform measured at point 122. In this example, the wafer waveform has a frequency of about 19 MHz and a waveform peak to peak amplitude of about 150 V. In this example, the pulse width is about 200 ns. And the resulting ion current is about 1 amp.

The waveform frequency and/or the waveform amplitude may be dependent on the values of inductor 87, inductor 88, capacitor 23, the capacitor 12, and the capacitor 13. For example, the inductor 87 and/or the inductor 88 may have an inductance less than about 500 nh, 250 nH, 100 nH, 50 nH, 25 nH, etc. For these specific waveforms, the inductor 87 and/or the inductor 88 may have an inductance of about 50 nH. The capacitor 23 may have a capacitance less than about 1,000 pF, 500 pF, 250 pF, 100 pF, 50 pF, etc. For these specific waveforms, the capacitor 23 may have a capacitance of about 250 pF.

The capacitance of capacitor 12 and capacitor 13 may or may not be fixed by the load 106 and may vary from application to application. The capacitor 12 may a capacitance of about 6.4 nF, and the capacitor 13 may have a capacitance of about 25 pF.

Figure 4:
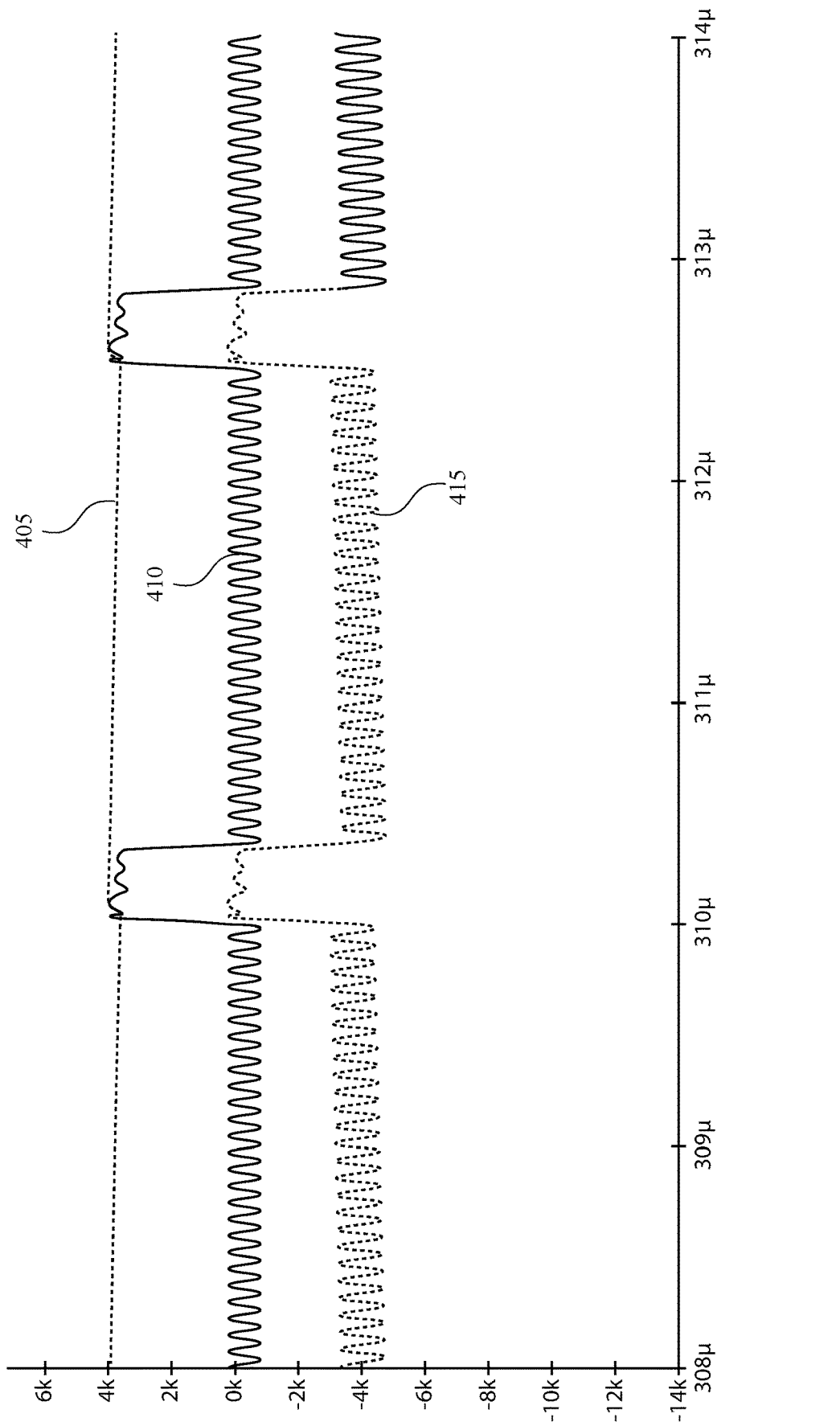
FIG. 4 shows three waveforms produced by the nanosecond pulser system according to some embodiments.

FIG. 4 shows three waveforms produced by the nanosecond pulser system 100 according to some embodiments. The waveform 410 is measured at the point 124 and the waveform 415 is measured at the point 122 (the wafer waveform). The waveform 405 is the difference between the waveform measured at point 121 and the point 122. In this example, the wafer waveform has frequency of about 19 MHz and a waveform peak to peak amplitude of about 1.75 kV. The pulse width is about 350 ns. And the resulting ion current is about 1 amp. Thus, in this example, by changing the pulse width of the pulses from 250 ns to 350 ns, the waveform amplitude increased from 150 V to 1.75 kV.

The waveform frequency and/or the waveform amplitude may be dependent on the values of inductor 87, inductor 88, capacitor 23, the capacitor 12, and the capacitor 13. For example, the inductor 87 and/or the inductor 88 may have an inductance less than about 500 nh, 250 nH, 100 nH, 50 nH, 25 nH, etc. For these specific waveforms, the inductor 87 and/or the inductor 88 may have an inductance of about 50 nH. The capacitor 23 may have a capacitance less than about 1,000 pF, 500 pF, 250 pF, 100 pF, 50 pF, etc. For these specific waveforms, the capacitor 23 may have a capacitance of about 250 pF.

The capacitance of capacitor 12 and capacitor 13 may or may not be fixed by the load 106 and may vary from application to application. In this example, the capacitor 12 may a capacitance of about 6.4 nF, and the capacitor 13 may have a capacitance of about 25 pF.

Figure 5:
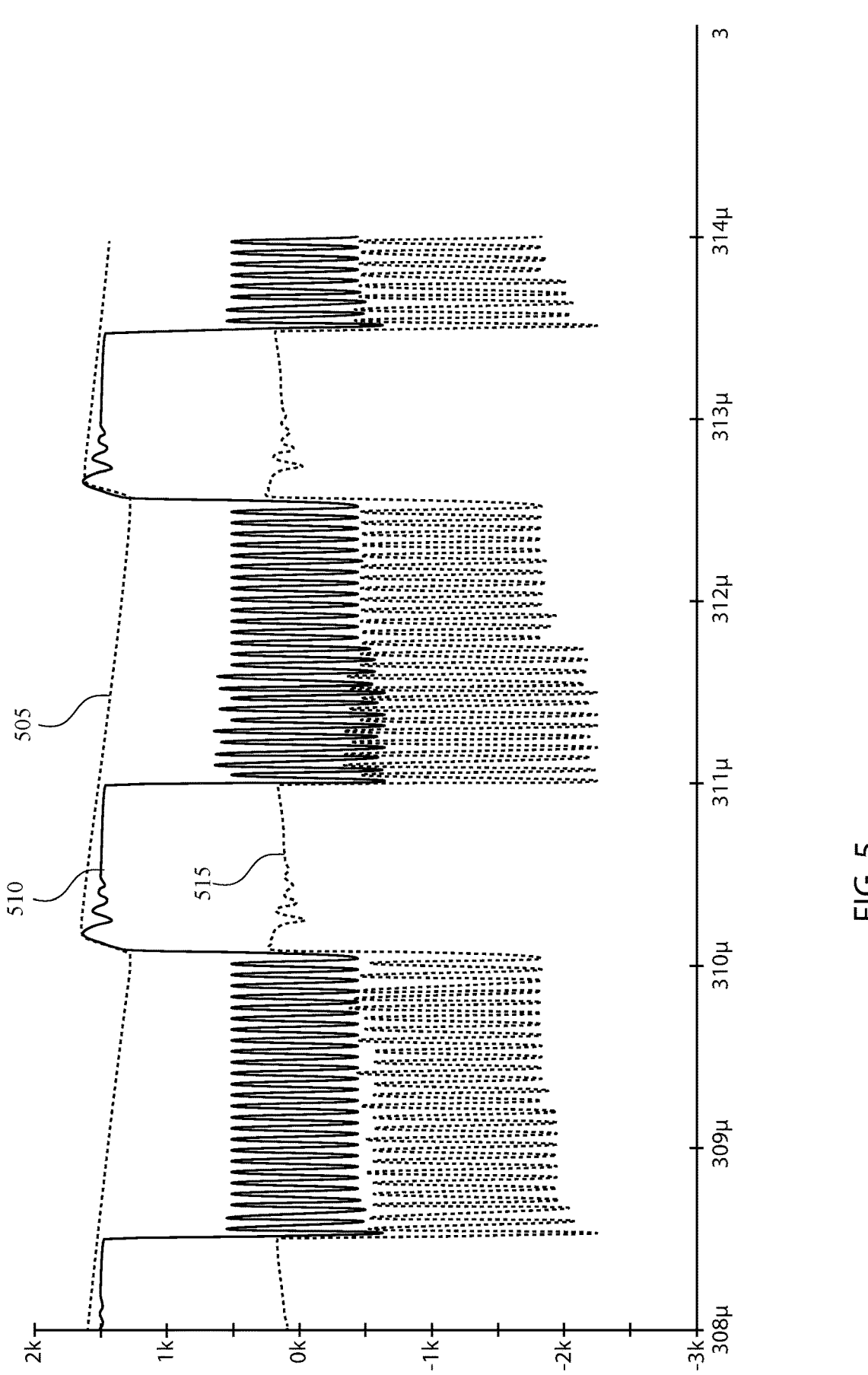
FIG. 5 shows three waveforms produced by the nanosecond pulser system according to some embodiments.

FIG. 5 shows three waveforms produced by the nanosecond pulser system 100 according to some embodiments. The waveform 510 is measured at the point 124 and the waveform 515 is measured at the point 122 (the wafer waveform). The waveform 505 is the difference between the waveform measured at point 121 and the point 122. In this example, the wafer waveform has frequency of about 19 MHz and a waveform peak to peak amplitude of about 1.75 kV. The pulse width is about 1,000 ns. And the ion current is about 1 amp.

The waveform frequency and/or the waveform amplitude may be dependent on the values of inductor 87, inductor 88, capacitor 23, the capacitor 12, and the capacitor 13. For example, the inductor 87 and/or the inductor 88 may have an inductance less than about 500 nh, 250 nH, 100 nH, 50 nH, 25 nH, etc. For these specific waveforms, the inductor 87 and/or the inductor 88 may have an inductance of about 50 nH. The capacitor 23 may have a capacitance less than about 1,000 pF, 500 pF, 250 pF, 100 pF, 50 pF, etc. For these specific waveforms, the capacitor 23 may have a capacitance of about 250 pF.

The capacitance of capacitor 12 and capacitor 13 may or may not be fixed by the load 106 and may vary from application to application. In this example, the capacitor 12 may a capacitance of about 6.4 nF, and the capacitor 13 may have a capacitance of about 25 pF.

Thus, in this example, by changing the pulse width of the pulses from 350 ns to 1,000 ns, the waveform amplitude reaches a limit (at about 400 ns) and does not appreciably increase the waveform peak to peak amplitude.

Figure 6:
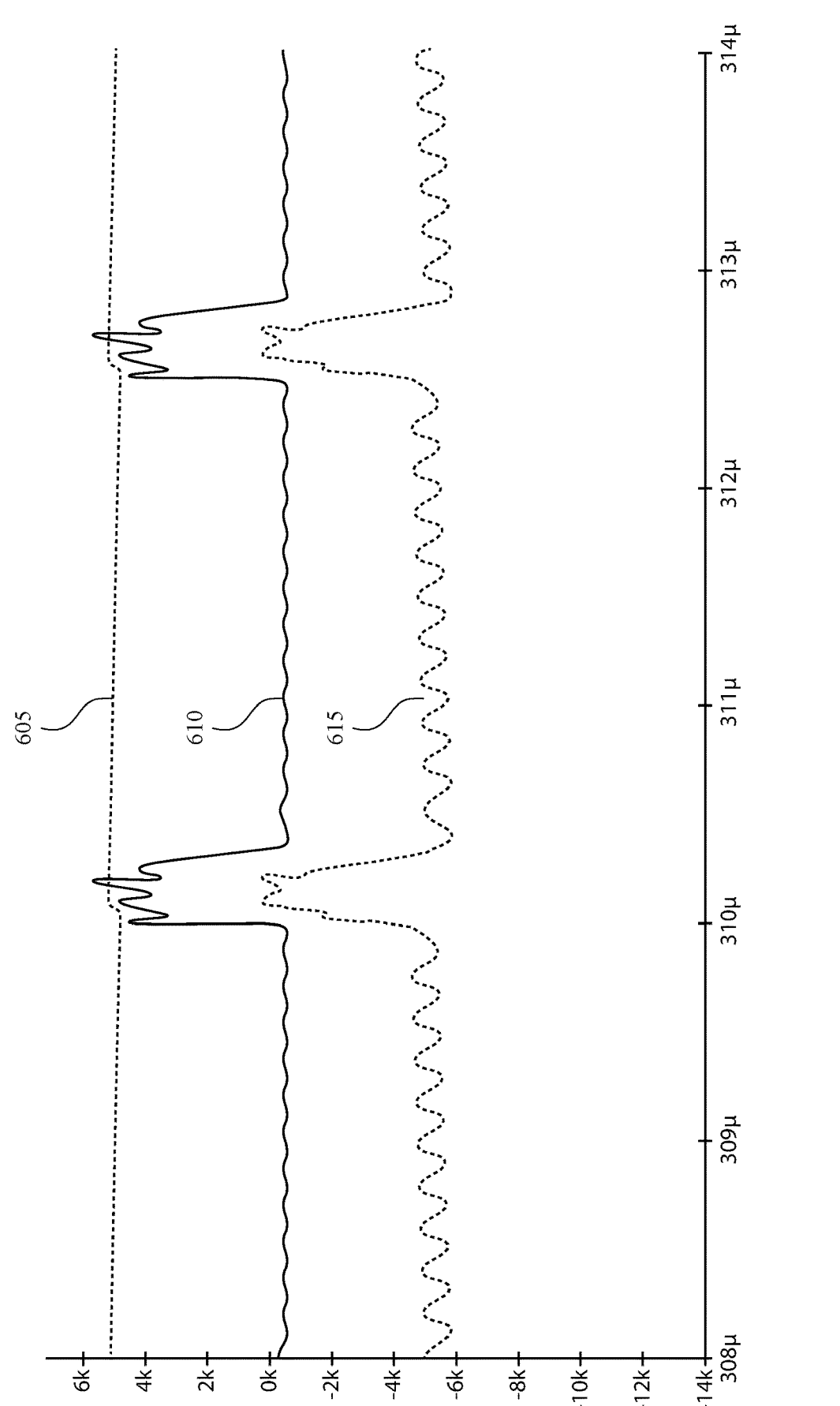
FIG. 6 shows three waveforms produced by the nanosecond pulser system according to some embodiments.

FIG. 6 shows three waveforms produced by the nanosecond pulser system 100 according to some embodiments. The waveform 610 is measured at the point 124 and the waveform 615 is measured at the point 122 (the wafer waveform). The waveform 605 is the difference between the waveform measured at point 121 and the point 122. In this example, the wafer waveform has frequency of about 5.0 MHz and a waveform peak to peak amplitude of about 764 V. The pulse width is about 200 ns. And the resulting ion current is about 1 amp.

The waveform frequency and/or the waveform amplitude may be dependent on the values of inductor 87, inductor 88, capacitor 23, the capacitor 12, and the capacitor 13. For example, the inductor 87 and/or the inductor 88 may have an inductance less than about 500 nh, 250 nH, 100 nH, 50 nH, 25 nH, etc. For these specific waveforms, the inductor 87 and/or the inductor 88 may have an inductance of about 400 nH. For example, the capacitor 23 may have a capacitance less than about 10 nF, 5 nF, 1 nF, 500 pF, 250 pF, 100 pF, 50 pF, etc. For these specific waveforms, the capacitor 23 may have a capacitance of about 1 nF.

The capacitance of capacitor 12 and capacitor 13 may or may not be fixed by the load 106 and may vary from application to application. In this example, the capacitor 12 may a capacitance of about 6.4 nF, and, in this example, the capacitor 13 may have a capacitance of about 1 nF.

Thus, in this example, by increasing the inductance of inductor 87, the inductance of inductor 88, and the capacitance of capacitor C8, as well as decreasing the capacitance 13, the waveform frequency is decreased to about 5.0 MHz. In addition, in this example, having a pulse width beneath about 250 ns (e.g., 197 ns) does not produce as much waveform amplitude.

Figure 7:
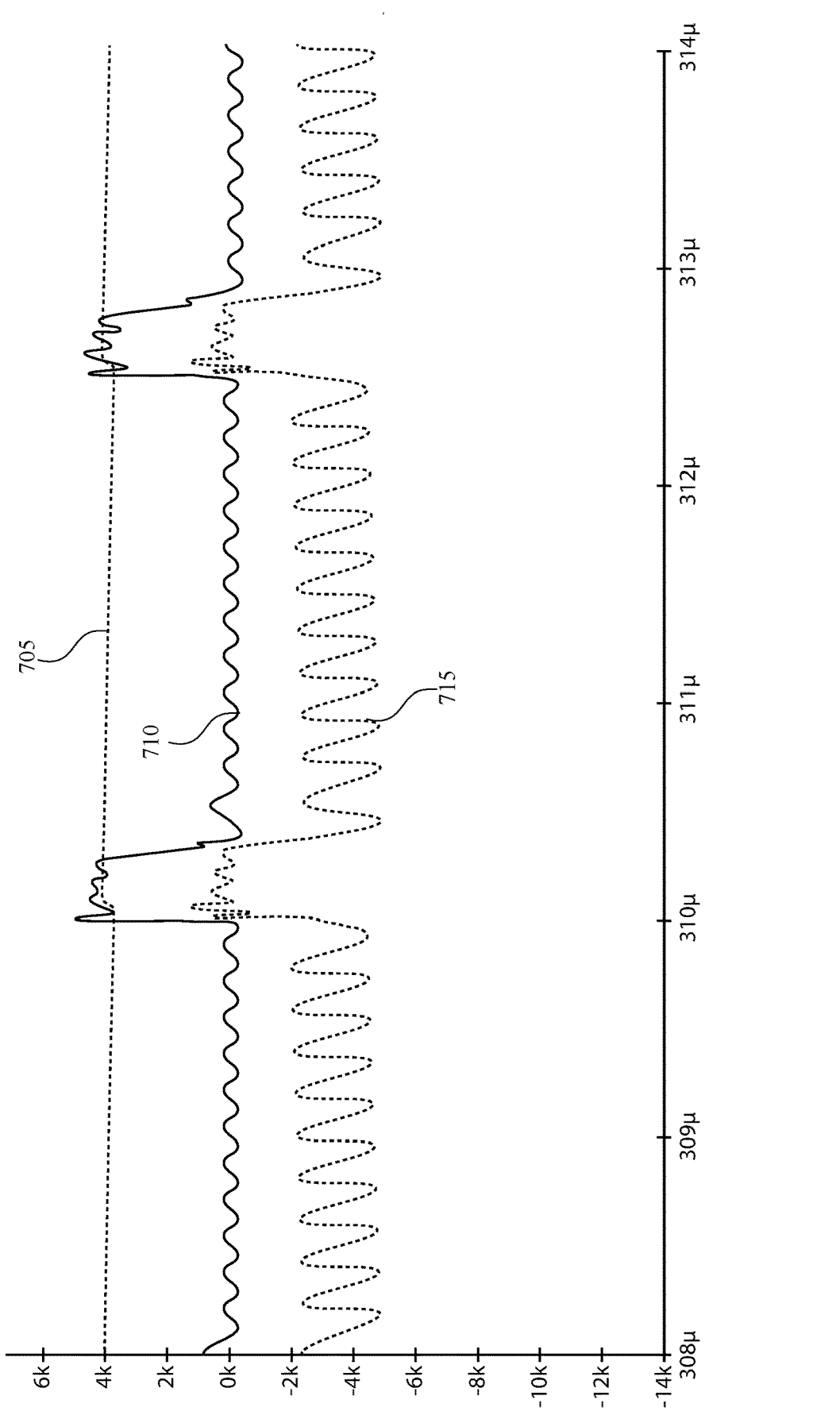
FIG. 7 shows three waveforms produced by the nanosecond pulser system according to some embodiments.

FIG. 7 shows three waveforms produced by the nanosecond pulser system 100 according to some embodiments. The waveform 710 is measured at the point 124 and the waveform 715 is measured at the point 122 (the wafer waveform). The waveform 705 is the difference between the waveform measured at point 121 and the point 122. In this example, the wafer waveform has frequency of about 5.0 MHz and a waveform peak to peak amplitude of about 2.5 kV. The pulse width is about 350 ns. And the resulting ion current is about 1 amp.

The waveform frequency and/or the waveform amplitude may be dependent on the values of inductor 87, inductor 88, capacitor 23, the capacitor 12, and the capacitor 13. For example, the inductor 87 and/or the inductor 88 may have an inductance less than about 400 nh, 250 nH, 100 nH, 50 nH, 25 nH, etc. For these specific waveforms, the inductor 87 and/or the inductor 88 may have an inductance of about 400 nH. For example, the capacitor 23 may have a capacitance less than about 10 nF, 5 nF, 1 nF, 500 pF, 250 pF, 100 pF, 50 pF, etc. For these specific waveforms, the capacitor 23 may have a capacitance of about 1 nF.

The capacitance of capacitor 12 and capacitor 13 may or may not be fixed by the load 106 and may vary from application to application. In this example, the capacitor 12 may a capacitance of about 6.4 nF, and, in this example, the capacitor 13 may have a capacitance of about 1 nF.

Thus, in this example, by increasing the inductance of inductor 87 and the inductance of inductor 88 the pulse amplitude decreases although the waveform amplitude increases.

Figure 8:
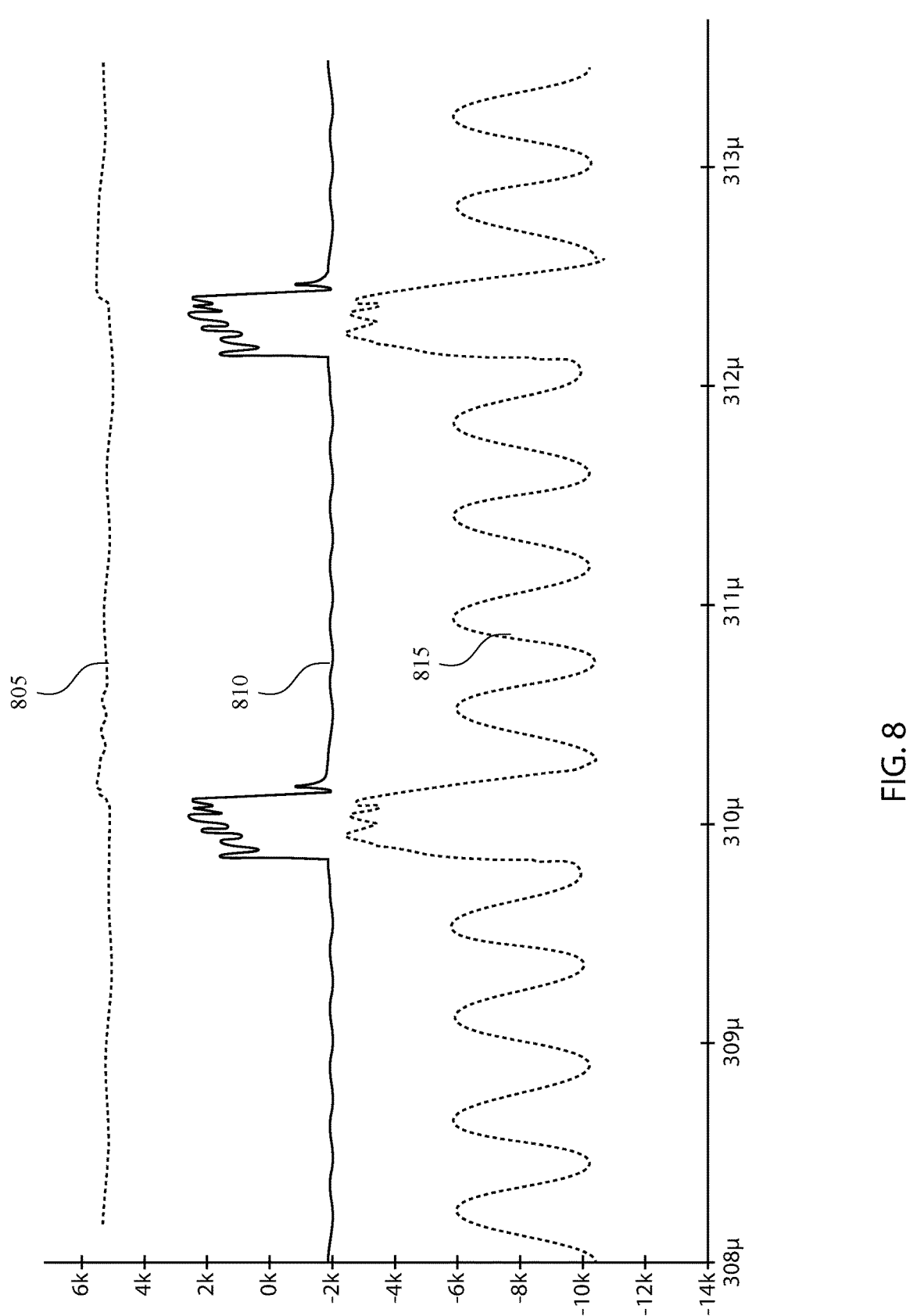
FIG. 8 shows three waveforms produced by the nanosecond pulser system according to some embodiments.

FIG. 8 shows three waveforms produced by the nanosecond pulser system 100 according to some embodiments. The waveform 810 is measured at the point 124 and the waveform 815 is measured at the point 122 (the wafer waveform). The waveform 805 is the difference between the waveform measured at point 121 and the point 122. In this example, the wafer waveform has frequency of about 2.0 MHz and a waveform peak to peak amplitude of about 4.78 kV. The pulse width is about 350 ns. And the resulting ion current is about 1 amp.

The waveform frequency and/or the waveform amplitude may be dependent on the values of inductor 87, inductor 88, capacitor 23, the capacitor 12, and the capacitor 13. For example, the inductor 87 and/or the inductor 88 may have an inductance of about 2,000 nh, 1,500 nH, 1,000 nH, 500 nH, 100 nH, 50 nH, 25 nH, etc. For these specific waveforms, the inductor 87 and/or the inductor 88 may have an inductance of about 1,800 nH. For example, the capacitor 23 may have a capacitance less than about 10 nF, 5 nF, 1 nF, 500 pF, 250 pF, 100 pF, 50 pF, etc. For these specific waveforms, the capacitor 23 may have a capacitance of about 1.5 nF.

The capacitance of capacitor 12 and capacitor 13 may or may not be fixed by the load 106 and may vary from application to application. In this example, the capacitor 12 may a capacitance of about 6.4 nF, and the capacitor 13 may have a capacitance of about 100 pF.

Thus, in this example, by increasing the inductance of inductor 87 and the inductance of inductor 88 the pulse amplitude decreases although the waveform amplitude increases.

Unless otherwise specified, the term "substantially" means within 5% or 10% of the value referred to or within manufacturing tolerances. Unless otherwise specified, the term "about" means within 5% or 10% of the value referred to or within manufacturing tolerances.

The conjunction "or" is inclusive.

The terms "first", "second", "third", etc. are used to distinguish respective elements and are not used to denote a particular order of those elements unless otherwise specified or order is explicitly described or required.

Numerous specific details are set forth to provide a thorough understanding of the claimed subject matter. However, those skilled in the art will understand that the claimed subject matter may be practiced without these specific details. In other instances, methods, apparatuses or systems that would be known by one of ordinary skill have not been described in detail so as not to obscure claimed subject matter.

The system or systems discussed are not limited to any particular hardware architecture or configuration. A computing device can include any suitable arrangement of components that provides a result conditioned on one or more inputs. Suitable computing devices include multipurpose microprocessor-based computer systems accessing stored software that programs or configures the computing system from a general-purpose computing apparatus to a specialized computing apparatus implementing one or more embodiments of the present subject matter. Any suitable programming, scripting, or other type of language or combinations of languages may be used to implement the teachings contained in software to be used in programming or configuring a computing device.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations and/or additions to the present subject matter as would be readily apparent to one of ordinary skill in the art.

That which is claimed:

1. A power supply comprising:
a high voltage power supply;
a nanosecond pulser electrically coupled with the high voltage power supply that switches voltage from the high voltage power supply at high frequencies;
a transformer having a primary side and a secondary side, the nanosecond pulser electrically coupled with the primary side of the transformer; and
an output electrically coupled with the transformer producing a waveform, the waveform comprising:
a plurality of high voltage pulses having a pulse amplitude greater than about 2 kV, a pulse width, and a pulse repetition frequency; and
a sinusoidal waveform having a waveform frequency and a waveform amplitude greater than 100 V, wherein the waveform amplitude is less than the pulse amplitude; and wherein the pulse repetition frequency is less than the waveform frequency.

2. The power supply according to claim 1, further comprising an energy recovery circuit electrically coupled with the secondary side of the transformer, the energy recovery circuit comprising:
an energy recovery inductor electrically coupled with the high voltage power supply;
a crowbar diode arranged in parallel with the secondary side of the transformer; and
a second diode disposed in series with the energy recovery inductor and arranged to conduct current from a load through the energy recovery inductor to the high voltage power supply.

3. The power supply according to claim 1, wherein the power supply comprises stray inductance and stray capacitance, wherein the waveform frequency and/or the waveform amplitude are dependent at least in part on either or both the stray inductance and the stray capacitance.

4. The power supply according to claim 1, wherein the waveform frequency and/or the waveform amplitude are dependent at least in part on the pulse width.

5. The power supply according to claim 1, wherein the power supply comprises stray inductance having an inductance less than about 400 nH.

6. The power supply according to claim 1, wherein the power supply comprises stray capacitance having a capacitance less than about 20 nF.

7. The power supply according to claim 1, wherein the output is coupled with a plasma chamber, wherein the sinusoidal waveform creates a plasma within the plasma chamber and the plurality of high voltage pulses accelerate plasma particles within the plasma chamber.

8. The power supply according to claim 1, wherein the pulse amplitude is greater than about 5 kV, and wherein each of the plurality of high frequency pulses have a pulse rise time that is less than about 20 ns.

9. A power supply comprising:
a high voltage power supply;
a nanosecond pulser electrically coupled with the high voltage power supply and switches voltage from the high voltage power supply at high frequencies;
a transformer having a primary side and a secondary side, the nanosecond pulser electrically coupled with the primary side of the transformer;
an output electrically coupled with the transformer producing a waveform, the waveform comprising:
a plurality of high voltage pulses having a pulse amplitude, a pulse width, and a pulse repetition frequency; and
a sinusoidal waveform having a waveform amplitude and a waveform frequency;
a stray capacitance measured from the output having a capacitance less than about 20 nF; and
a stray inductance measured from the output having an inductance less than about 400 nH.

10. The power supply according to claim 9, wherein the pulse amplitude is greater than about 5 kV, and wherein each of the plurality of high frequency pulses have a pulse rise time that is less than about 20 ns.

11. The power supply according to claim 9, wherein the waveform amplitude is less than the pulse amplitude.

12. The power supply according to claim 9, wherein the pulse repetition frequency is less than the waveform frequency.

13. The power supply according to claim 9, wherein the waveform frequency is between about 2 MHz and 20 MHz.

14. The power supply according to claim 9, further comprising an energy recovery circuit electrically coupled with the secondary side of the transformer, the energy recovery circuit comprising:
an energy recovery inductor electrically coupled with the high voltage power supply;
a crowbar diode arranged in parallel with the secondary side of the transformer; and
a second diode disposed in series with the energy recovery inductor and arranged to conduct current from a load through the energy recovery inductor to the high voltage power supply.

15. A semiconductor plasma system comprising:
a plasma chamber; and
a high voltage power supply comprising:
a high voltage power supply;
a nanosecond pulser electrically coupled with the high voltage power supply that switches voltage from the high voltage power supply at high frequencies;
a transformer having a primary side and a secondary side, the nanosecond pulser electrically coupled with the primary side of the transformer; and
an output electrically coupled with the transformer and the plasma chamber, the output producing a waveform within the plasma chamber, the waveform comprising:
a sinusoidal waveform configured to create a plasma within the plasma chamber, the sinusoidal waveform having a waveform frequency and a waveform amplitude greater than 100 V; and a plurality of high voltage pulses that accelerate plasma particles within the plasma chamber, the plurality of high voltage pulses having a pulse amplitude greater than about 2 kV, a pulse width, and a pulse repetition frequency.

16. The semiconductor plasma system according to claim 15, wherein plasma chamber produces a plasma sheath having a sheath capacitance, wherein the waveform frequency and/or the waveform amplitude are dependent on the sheath capacitance.

17. The semiconductor plasma system according to claim 15, wherein the waveform frequency is greater than about 10 MHz.

18. The semiconductor plasma system according to claim 15, wherein the power supply further comprises an energy recovery circuit electrically coupled with the secondary side of the transformer, the energy recovery circuit comprising:

an energy recovery inductor electrically coupled with the high voltage power supply;

a crowbar diode arranged in parallel with the secondary side of the transformer; and a second diode disposed in series with the energy recovery inductor and arranged to conduct current from a load through the energy recovery inductor to the high voltage power supply.

\*　\*　\*　\*　\*